US010228600B2

(12) United States Patent
Kim et al.

(10) Patent No.: US 10,228,600 B2
(45) Date of Patent: Mar. 12, 2019

(54) LIGHT CONTROLLING APPARATUS AND TRANSPARENT DISPLAY INCLUDING THE SAME

(71) Applicant: LG Display Co., Ltd., Seoul (KR)

(72) Inventors: Ki Han Kim, Gyeonggi-do (KR); Ji Young Ahn, Gyeonggi-do (KR); Moon Sun Lee, Chungcheongbuk-do (KR); Pu Reum Kim, Incheon (KR); Seok Won Ji, Incheon (KR)

(73) Assignee: LG Display Co., Ltd., Seoul (KR)

( * ) Notice: Subject to any disclaimer, the term of this patent is extended or adjusted under 35 U.S.C. 154(b) by 175 days.

(21) Appl. No.: 14/754,957

(22) Filed: Jun. 30, 2015

(65) Prior Publication Data

US 2015/0378205 A1 Dec. 31, 2015

(30) Foreign Application Priority Data

Jun. 30, 2014 (KR) .......................... 10-2014-0080623
Jun. 5, 2015 (KR) .......................... 10-2015-0080207

(51) Int. Cl.
*G02F 1/1347* (2006.01)
*C09K 19/02* (2006.01)
(Continued)

(52) U.S. Cl.
CPC .......... *G02F 1/13718* (2013.01); *C09K 19/02* (2013.01); *C09K 19/544* (2013.01); *C09K 19/586* (2013.01); *C09K 19/60* (2013.01); *G02F 1/1339* (2013.01); *G02F 1/13476* (2013.01); *G02F 1/13737* (2013.01);
(Continued)

(58) Field of Classification Search
CPC ....................... G02F 1/13718; G02F 1/133377
See application file for complete search history.

(56) References Cited

U.S. PATENT DOCUMENTS 5,574,593 A 11/1996 Wakita et al.
5,942,154 A 8/1999 Kim et al.
(Continued)

FOREIGN PATENT DOCUMENTS

CN 1148183 A 4/1997
KR 10-2009-0072505 A 7/2009
(Continued)

OTHER PUBLICATIONS

Yang, D.K., et al.; "Cholesteric liquid crystal/polymer dispersion for haze-free light shutters," Applied Physics Letters, American Institute of Physics, vol. 60, No. 25, Jun. 22, 1992, pp. 3102-3104.
(Continued)

*Primary Examiner* — Jessica M Merlin
(74) *Attorney, Agent, or Firm* — Morgan, Lewis & Bockius LLP

(57) ABSTRACT

A light controlling apparatus includes first and second substrates facing each other; a first electrode on the first substrate; a second electrode on the second substrate; and a liquid crystal layer between the first electrode and the second electrode, the liquid crystal layer including cholesteric liquid crystals, wherein the cholesteric liquid crystals have a focal conic state in a light shielding mode in case where no voltage is applied, and have a homeotropic state in a transparent mode in case where a voltage is applied.

18 Claims, 11 Drawing Sheets

(51) Int. Cl.
*C09K 19/58* (2006.01)
*C09K 19/60* (2006.01)
*H01L 27/32* (2006.01)
*G02F 1/137* (2006.01)
*G02F 1/1339* (2006.01)
*C09K 19/54* (2006.01)
*G02F 1/1333* (2006.01)

(52) U.S. Cl.
CPC .... *C09K 2019/546* (2013.01); *G02F 1/13475* (2013.01); *G02F 1/13725* (2013.01); *G02F 1/133377* (2013.01); *G02F 2001/13756* (2013.01); *G02F 2001/13775* (2013.01); *G02F 2201/44* (2013.01); *G02F 2202/04* (2013.01); *G02F 2203/01* (2013.01); *G02F 2203/03* (2013.01); *G02F 2203/64* (2013.01); *H01L 27/3232* (2013.01); *H01L 2251/5323* (2013.01)

(56) References Cited

U.S. PATENT DOCUMENTS

| | | | |
|---|---|---|---|
| 2003/0133069 A1 | 7/2003 | Jeong et al. | |
| 2006/0262248 A1* | 11/2006 | Burberry | G02F 1/133707 349/86 |
| 2008/0303982 A1 | 12/2008 | Jin et al. | |
| 2008/0316395 A1 | 12/2008 | O'Keeffe | |
| 2009/0168136 A1* | 7/2009 | Jacobs | G02F 1/0136 359/246 |
| 2009/0244413 A1 | 10/2009 | Ishikawa et al. | |
| 2009/0290078 A1* | 11/2009 | Yang | G02F 1/13718 349/16 |
| 2011/0019132 A1* | 1/2011 | Jang | C09K 19/544 349/86 |
| 2011/0122358 A1* | 5/2011 | Kim | G02F 1/133371 349/156 |
| 2012/0268438 A1 | 10/2012 | Lee | |
| 2012/0268669 A1* | 10/2012 | Ishikawa | G02F 1/13718 349/12 |
| 2012/0320298 A1* | 12/2012 | Suzuki | G02F 1/133553 349/43 |
| 2014/0009720 A1 | 1/2014 | Huang | |

FOREIGN PATENT DOCUMENTS

KR 10-2012-0120554 A 11/2012
KR 10-2013-0039211 A 4/2013

OTHER PUBLICATIONS

Communication dated Jul. 17, 2017 from the European Patent Office in related European application No. 15174253.3.
Second Notification of Office Action dated Jul. 11, 2018 from the State Intellectual Property Office of China in related ahinese patent application No. 201510369697.4.

* cited by examiner

LIGHT CONTROLLING APPARATUS AND TRANSPARENT DISPLAY INCLUDING THE SAME

CROSS REFERENCE TO RELATED APPLICATIONS

This application claims the benefit of the Korean Patent Application No. 10-2014-0080623 filed on Jun. 30, 2014 and No. 10-2015-0080207 filed on Jun. 5, 2015 which are hereby incorporated by reference for all purposes as if fully set forth herein.

BACKGROUND OF THE INVENTION

Field of the Invention

The present invention relates to a light controlling apparatus and a transparent display device, and more particularly, to a light controlling apparatus and a transparent display device having a transparent mode and a light-shielding mode.

Discussion of the Related Art

Recently, with the advancement of the information age, display devices for processing and displaying a large amount of information have been developed. More particularly, various display devices have been introduced and spotlighted. Examples of display devices include liquid crystal display (LCD) devices, plasma display panel (PDP) devices, field emission display (FED) devices, electroluminescence display (ELD) devices, and organic electroluminescent display (OLED) devices. The display devices generally have properties of a thin profile, light weight and low power consumption. Thus, their fields of application have continuously increased. In particular, in most electronic devices or mobile devices, a display device has been used as a user interface.

Also, transparent display devices, through which a user may see objects or images located at an opposite side, have been developed. The transparent display devices may have advantages of better use of space, interior and design, and may be applied in various application fields. The transparent display devices may solve spatial and temporal restrictions of the existing electronic devices by realizing functions of information recognition, information processing, and information display as a transparent electronic device. Such transparent display devices may be used for a smart window, which may be used as a window of a smart home or a smart car.

Of the transparent display devices, the transparent display device based on LCD may be realized by applying an edge type backlight thereto. However, the transparent display device to which LCD technologies are applied has a problem in that transparency is deteriorated by a polarizing plate used for realization of black. Also, a problem occurs in outdoor visibility of the transparent display device based on LCD.

The transparent display device based on OLED has power consumption higher than that of the LCD and has a difficulty in displaying a true black. Also, although the transparent display device based on OLED has no problem regarding contrast ratio in a dark environment, a problem occurs in that a contrast ratio is deteriorated under a normal lighting environment.

To solve the above problems, a method for applying a light controlling apparatus to a transparent display device has been suggested, wherein the light controlling apparatus may realize a transparent mode that transmits light incident upon a rear surface of the transparent display device and a light-shielding mode shielding the light. A reflective liquid crystal display device and a method for controlling the same are disclosed in Korean Patent Application No. 10-2011-0103726.

SUMMARY

Accordingly, the present invention is directed to a light controlling apparatus and a transparent display device including the same, which substantially obviate one or more problems due to limitations and disadvantages of the related art.

An object of the present invention is to provide a light controlling apparatus, which may transmit or shield light by using a focal conic state and a homeotropic state of cholesteric liquid crystals, and a transparent display device including the same.

Another object of the present invention is to provide a transparent display device that may increase a light shielding ratio in a light shielding mode without deteriorating a transmittance ratio in a transparent mode by applying cholesteric liquid crystals that reflect light of an infrared wavelength range and an ultraviolet wavelength range.

Still another object of the present invention is to provide a light controlling apparatus of which a light-shielding ratio is high in a light-shielding mode by using a liquid crystal layer that includes dichroic dyes.

Still another object of the present invention is to provide a light controlling apparatus that does not need separate power consumption to realize a light-shielding mode.

Still another object of the present invention is to provide a light controlling apparatus based on a liquid crystal layer, which may reduce the cost by simplifying its manufacturing process.

Still another object of the present invention is to provide a light controlling apparatus based on cholesteric liquid crystals that do not reflect light of a visible ray wavelength range.

Still another object of the present invention is to provide a light controlling apparatus that may display a specific color in accordance with dichroic dyes to allow a rear background not to be seen.

Still another object of the present invention is to provide a light controlling apparatus that includes spacers for maintaining a cell gap of a liquid crystal layer to protect the inside of the liquid crystal layer when an external force is applied thereto, and at the same time to allow the spacers to serve as barriers for partitioning the liquid crystal layer.

Still another object of the present invention is to provide a light controlling apparatus that includes refractive index matching layers to increase a transmittance ratio by reducing a refractive index difference.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light controlling apparatus comprises first and second substrates facing each other; a first electrode on the first substrate; a second electrode on the second substrate; and a liquid crystal layer between the first electrode and the second electrode, the liquid crystal layer including cholesteric liquid crystals, wherein the cholesteric liquid crystals have a focal conic state in a light shielding mode in case where no voltage is applied, and have a homeotropic state in a transparent mode in case where a voltage is applied.

In another aspect, a light controlling apparatus comprises first and second substrates facing each other; and a liquid crystal layer between the first substrate and the second substrate, the liquid crystal layer including cholesteric liquid crystals, wherein the cholesteric liquid crystals are arranged randomly in a light shielding mode to scatter incident light, and are arranged in a vertical direction in a transparent mode to transmit incident light.

In yet another aspect, a transparent display device comprises a transparent display panel including a transmissive area and an emissive area displaying an image; and a light controlling apparatus on at least one surface of the transparent display panel, wherein the light controlling apparatus includes a liquid crystal layer having cholesteric liquid crystals, the liquid crystal layer having a focal conic state in a display mode in which the emissive area displays the image, whereby a light shielding mode for shielding incident light is realized.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Figure 1:
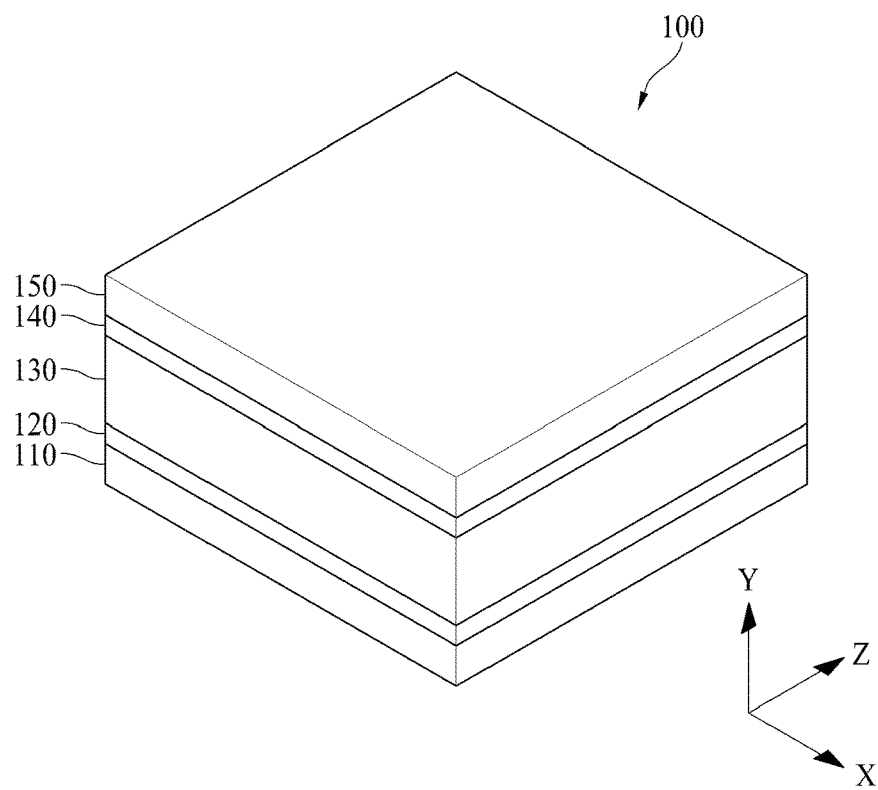
FIG. 1 is a perspective view illustrating a light controlling apparatus according to one embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted.

In a case where "comprise;" "have," and "include" described in the present specification are used, another part may be added unless "only" is used. The terms of a singular form may include plural forms unless referred to the contrary.

In construing an element, the element is construed as including an error range although there is no explicit description.

In description of embodiments of the present invention, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as "after," "subsequent," "next," and "before," a case which is not continuous may be included unless "just" or "direct" is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

"X-axis direction," "Y-axis direction," and "Z-axis direction" should not be construed by a geometric relation only of a mutual vertical relation, and may have broader directionality within the range that elements of the present invention may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, example embodiments of the present invention will be described in detail with reference to the accompanying drawings.

A guest-host liquid crystal layer has been studied as a liquid crystal layer for using as a light controlling apparatus (or light shielding apparatus) of a transparent display device. In this case, guest means dichroic dyes added to liquid crystals, and host means the liquid crystals. In a guest-host mode, an arrangement direction of the liquid crystals is controlled by an electric field generated by an applied voltage, and the dichroic dyes are aligned simultaneously in the same direction as that of the liquid crystals. Therefore, incident light is scattered and absorbed by the liquid crystals and the dichroic dyes, whereby a light shielding mode is realized. If a voltage is applied, the liquid crystals and the dichroic dyes are aligned in a direction perpendicular to a substrate, and all the incident lights pass through the guest-host liquid crystals, whereby a transparent mode is realized.

At this time, the liquid crystals used for the host may be categorized into nematic liquid crystals, smectic liquid crystals and cholesteric liquid crystals.

Of the liquid crystals, the cholesteric liquid crystals may make a state transition or phase transition to three states of a planar state, a focal conic state and a homeotropic state, wherein the planar state and the focal conic state correspond to two stable states. The planar state may reflect light of a specific wavelength of incident lights, the focal conic state may scatter the incident lights, and the homeotropic state may transmit the incident light. Because the cholesteric liquid crystals may reflect, scatter or transmit light through state transition, they have been widely used for a reflective display device.

The cholesteric liquid crystals may realize a state where no voltage is applied in a light shielding mode using scattering of the focal conic state and realize a state where a voltage is applied state in a transparent mode. However, the cholesteric liquid crystals represent a white light shielding mode using light scattering only in the light shielding mode. Therefore, a black light shielding mode—not the white light shielding mode—should be realized for a light controlling apparatus for a transparent display device for improvement of visibility or a contrast ratio. Also, scattering characteristics should be improved when a scattering level of the focal conic state is weak.

Therefore, a guest-host liquid crystal layer (GHLC) may realize a black light shielding mode. In this case, the guest-host liquid crystal layer (GHLC) may be referred to as a liquid crystal layer that includes dyes. Also, with the present configuration, a liquid crystal including dyes may realize a black light shielding mode through light absorption of the dyes. However, if the liquid crystal layer including dyes does not include a polymer, it is difficult to realize scattering due to absence of the polymer, whereby a light shielding ratio is reduced in a light shielding mode. Therefore, if the amount of dyes included in the liquid crystal layer is increased to increase a light shielding ratio, a problem occurs in that a transmittance ratio in the transparent mode is reduced.

In this respect, the aforementioned problems are recognized herein and the present configuration provides a light controlling apparatus of a new structure, which may increase a transmittance ratio while minimizing light absorption of dyes in a transparent mode (or transmissive mode) and realize a light shielding mode, which may include a blocking state or a translucent state, having high a light shielding ratio in a light shielding mode.

[Light Controlling Apparatus]

A light controlling apparatus according to example embodiments of the present invention will be described in detail with reference to FIGS. 1, 2, 3A-3C, 4, 5, 6A, 6B, 7, 8A, 8B, and 9A-9C.

Figure 2:
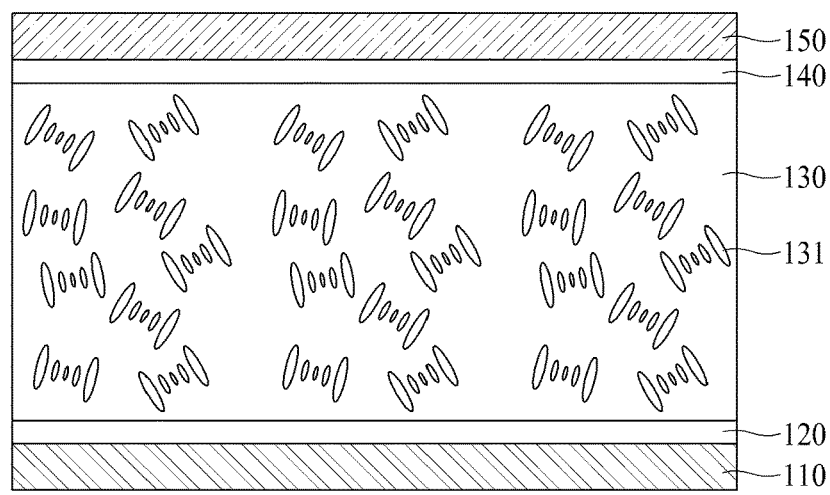
FIG. 2 is a cross-sectional view illustrating a detailed example of a light controlling apparatus of FIG. 1.

FIG. 1 is a perspective view illustrating a light controlling apparatus according to one embodiment of the present invention. FIG. 2 is a cross-sectional view illustrating a detailed example of a light controlling apparatus of FIG. 1. With reference to FIGS. 1 and 2, a light controlling apparatus 100 according to one embodiment of the present invention includes a first substrate 110, a first electrode 120, a liquid crystal layer 130, a second electrode 140, and a second substrate 150.

The first substrate 110 and the second substrate 150 may be a transparent glass substrate or a plastic film. For example, the first substrate 110 and the second substrate 150 may be, but are not limited to, a sheet or film that includes cellulose resin, such as TAC (triacetyl cellulose) or DAC (diacetyl cellulose), COP (cyclo olefin polymer), such as norbornene derivatives, acryl resin, such as COC (cyclo olefin copolymer) or PMMA (poly(methylmethacrylate)), polyolefin, such as PC (polycarbonate), PE (polyethylene) or PP (polypropylene), polyester, such as PVA (polyvinyl alcohol), PES (poly ether sulfone), PEEK (polyetheretherketone), PEI (polyetherimide), PEN (polyethylenenaphthalate), and PET (polyethyleneterephthalate), PI (polyimide), PSF (polysulfone), or fluoride resin.

The first electrode 120 is provided on the first substrate 110, and the second electrode 140 is provided on the second substrate 150. The first electrode 120 may be provided on the entirety of one surface of the first substrate 110, and the second electrode 140 may be provided on the entirety of one surface of the second substrate 150. Each of the first and second electrodes 120 and 140 may be a transparent electrode. For example, each of the first and second electrodes 120 and 140 may be, but are not limited to, silver oxide (AgO or $Ag_2O$ or $Ag_2O_3$), aluminum oxide (e.g., $Al_2O_3$), tungsten oxide (e.g., $WO_2$ or $WO_3$ or $W_2O_3$), magnesium oxide (e.g., MgO), molybdenum oxide (e.g., $MoO_3$), zinc oxide (e.g., ZnO), tin oxide (e.g., $SnO_2$), indium oxide (e.g., $In_2O_3$), chrome oxide (e.g., $CrO_3$ or $Cr_2O_3$), antimony oxide (e.g., $Sb_2O_3$ or $Sb_2O_5$), titanium oxide (e.g.; $TiO_2$), nickel oxide (e.g., NiO), copper oxide (e.g.; CuO or $Cu_2O$), vanadium oxide (e.g., $V_2O_3$ or $V_2O_5$), cobalt oxide (e.g., CoO), iron oxide (e.g.; $Fe_2O_3$ or $Fe_3O_4$), niobium oxide (e.g.; $Nb_2O_5$), Indium Tin Oxide (ITO), Indium Zinc Oxide (IZO), Aluminum doped Zinc Oxide (ZAO), Aluminum Tin Oxide (TAO) or Antimony Tin Oxide (ATO).

As shown in FIG. 1, the light controlling apparatus 100 includes a liquid crystal layer 130 between the first substrate 110 and the second substrate 150. As shown in FIG. 2, the liquid crystal layer 130 includes cholesteric liquid crystals 131 and a chiral dopant or a photo-sensitive chiral dopant, which for arranging the cholesteric liquid crystals 131 in a helical structure. The cholesteric liquid crystals 131 may be referred to as chiral nematic liquid crystals. Also, the liquid crystal layer 130 may further include an additive, such as a photo-initiator.

The cholesteric liquid crystals 131 may be nematic liquid crystals. The cholesteric liquid crystals 131 may be arranged to be rotated helically by the chiral dopant at the planar state and the focal conic state. Also, the cholesteric liquid crystals 131 may be arranged along a vertical direction (y-axis direction) at the homeotropic state. That is, the cholesteric liquid crystals 131 may be arranged in such a manner that their long axis is arranged along the vertical direction (y-axis direction) at the homeotropic state.

The light controlling apparatus 100 may be realized in a light shielding mode shielding light or a transparent mode transmitting light by controlling voltages applied to the first and second electrodes 120 and 140. Hereinafter, the transparent mode and the light shielding mode of the light controlling apparatus 100 will be described with reference to FIGS. 3A and 3B.

Figure 3A:
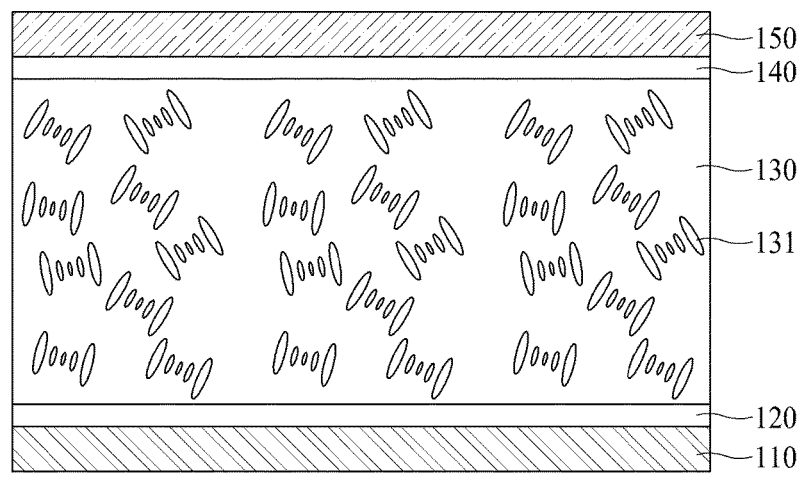
FIGS. 3A and 3B are cross-sectional views illustrating a light controlling apparatus of FIG. 2 in a light shielding mode and a transparent mode.
Figure 3B:
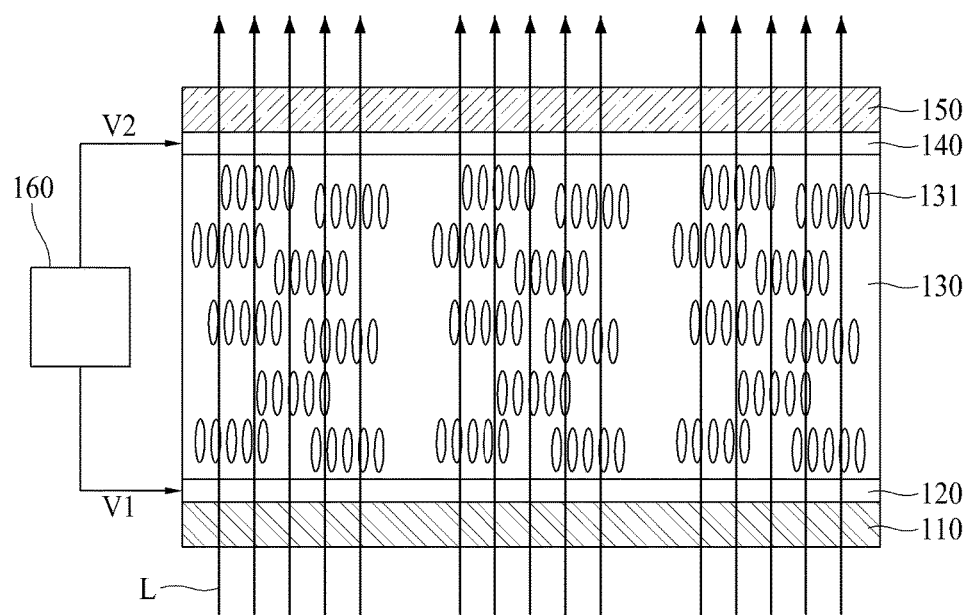

FIG. 3A is a cross-sectional view illustrating a light controlling apparatus of FIG. 2 in a light shielding mode, and FIG. 3B is a cross-sectional view illustrating a light controlling apparatus of FIG. 2 in a transparent mode.

The light controlling apparatus 100 may further include a voltage supply unit 160 supplying a predetermined voltage to each of the first and second electrodes 120 and 140 as shown in FIGS. 3A and 3B. The state of the cholesteric liquid crystals 133 is varied depending on the first voltage V1 applied to the first electrode 120 and the second voltage V2 applied to the second electrode 140, such that the light shielding mode shielding the incident light or the transparent mode transmitting the incident light may be realized.

As shown in FIG. 3A, because the light controlling apparatus 100 does not include an alignment film, if no voltage is applied, the cholesteric liquid crystals 131 of the liquid crystal layer 130 have the focal conic state. In more detail, the case where no voltage is applied includes the case where no voltage is applied to the first and second electrodes 120 and 140 or the case where a voltage difference between the first voltage V1 applied to the first electrode 120 and the second voltage V2 applied to the second electrode 140 is smaller than a first reference voltage. Alternatively, the case where no voltage is applied may include the case where the voltage difference between the first voltage applied to the first electrode and the second voltage applied to the second electrode is smaller than a reference voltage. At the focal conic state, the cholesteric liquid crystals 131 may be arranged to be rotated helically by the chiral dopant as shown in FIG. 3A. The cholesteric liquid crystals 131 arranged in a helical structure by the chiral dopant at the focal conic state may be arranged randomly.

In this case, light incident upon the liquid crystal layer 130 is subjected to light scattering by the cholesteric liquid crystals 131 as shown in FIG. 3A. That is, the liquid crystal layer 130 may display an opaque white color, such as a milk color, by scattering the incident light in a light shielding mode, thereby shielding the incident light. Therefore, in the example embodiment of the present invention, the cholesteric liquid crystals 131 of the liquid crystal layer 130 may be controlled to have the focal conic state in the light shielding mode such that a rear background of the light controlling apparatus may not be seen to a user.

As described with reference to FIG. 3A, the example embodiment of the present invention has an advantage in that power consumption is not required to realize the light shielding mode because the light shielding mode may be realized if no voltage is applied.

Also, because the liquid crystal layer 130 has a focal conic state that the cholesteric liquid crystals 131 arranged in a helical structure by the chiral dopant are arranged randomly at an initial state that no voltage is applied, the light controlling apparatus 100 according to the embodiment of the present invention does not need an alignment film for aligning the cholesteric liquid crystals 131. Therefore, in the example embodiment of the present invention, because a process for forming an alignment film may be omitted, a manufacturing process may be simplified, thereby reducing manufacturing cost.

As shown in FIG. 3B, if a voltage is applied, that is, if the first voltage V1 is applied to the first electrode 120 and the second voltage V2 is applied to the second electrode 140, the cholesteric liquid crystals 131 of the liquid crystal layer 130 have a homeotropic state by a vertical electric field (y-axis directional electric field). At the homeotropic state, the cholesteric liquid crystals 131 may be arranged in a vertical direction (y-axis direction) as shown in FIG. 3B.

In this case, because the cholesteric liquid crystals 131 are arranged in an incident direction of light, scattering of light incident upon the liquid crystal layer 130 is minimized. Therefore, most of the light incident upon the light controlling apparatus 100 may pass through the liquid crystal layer 130.

For the cholesteric liquid crystals 131 of the liquid crystal layer 130 to have the homeotropic state by the vertical electric field, a voltage should be applied thereto, especially the voltage difference between the first voltage V1 applied to the first electrode 120 and the second voltage V2 applied to the second electrode 140 should be greater than a second reference voltage. The second reference voltage may be greater than the first reference voltage. Alternatively, the case where a voltage is applied may include a case where the voltage difference between the first voltage applied to the first electrode and the second voltage applied to the second electrode is greater than the reference voltage. Particularly, in the example embodiment, because the vertical electric field is required such that the cholesteric liquid crystals 131 of the liquid crystal layer 130 are maintained at the homeotropic state, the first voltage V1 should continuously be applied to the first electrode 120, and the second voltage V2 should continuously be applied to the second electrode 140.

In the embodiment of the present invention, it is assumed that the light shielding mode represents that a transmittance ratio of the light controlling apparatus 100 is smaller than a % while the transparent mode represents that the transmittance ratio of the light controlling apparatus 100 is greater than b %. The transmittance ratio of the light controlling apparatus 100 represents a ratio of output light to light incident upon the light controlling apparatus 100. For example, a % may be, but not limited to, 10% to 50%, and b % may be, but not limited to, 60% to 90%.

In this case, if no voltage is applied to the first and second electrodes 120 and 140, or if the voltage difference between the first voltage V1 applied to the first electrode 120 and the second voltage V2 applied to the second electrode 140 is smaller than the first reference voltage, the light controlling apparatus 100 is realized in the light shielding mode in which the transmittance ratio of the light controlling apparatus 100 is smaller than a %. If the voltage difference between the first voltage V1 applied to the first electrode 120 and the second voltage V2 applied to the second electrode 140 is greater than the second reference voltage, the light controlling apparatus 100 is realized in the transparent mode in which the transmittance ratio of the light controlling apparatus 100 is greater than b %. If the voltage difference between the first voltage V1 applied to the first electrode 120 and the second voltage V2 applied to the second electrode 140 is more than the first reference voltage and less than the second reference voltage, the transmittance ratio of the light controlling apparatus 100 is neither smaller than a % nor greater than b %, whereby both the transparent mode and the light shielding mode are not satisfied.

Meanwhile, although the second reference voltage may be set to be greater than the first reference voltage, the second reference voltage may be substantially the same as the first reference voltage. In this case, a reference transmittance ratio of the light shielding mode and a reference transmittance ratio of the transparent mode may be c % equally. For example, if the voltage difference between the first voltage V1 applied to the first electrode 120 and the second voltage V2 applied to the second electrode 140 is smaller than the reference voltage, the light controlling apparatus 100 is realized in the light shielding mode in which the transmittance ratio of the light controlling apparatus 100 is smaller than c %. If the voltage difference between the first voltage V1 applied to the first electrode 120 and the second voltage V2 applied to the second electrode 140 is more than the reference voltage, the light controlling apparatus 100 is realized in the transparent mode in which the transmittance ratio of the light controlling apparatus 100 is equal to or greater than c %. For example, c % may be 10% to 50%.

Figure 3C:
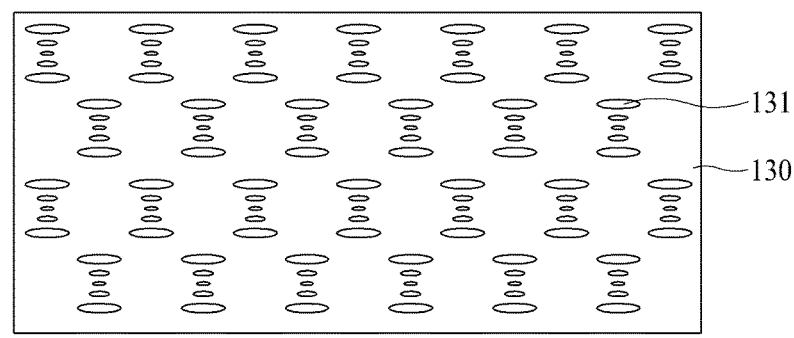
FIG. 3C is a cross-sectional view illustrating a liquid crystal layer including cholesteric liquid crystals at a planar state.

The cholesteric liquid crystals 131 of the liquid crystal layer 130 may have a planar state in which helical axes of the cholesteric liquid crystals 131 are arranged in a vertical direction (y-axis direction) as shown in FIG. 3C.

FIG. 3C is an exemplary view illustrating a liquid crystal layer that includes cholesteric liquid crystals of a planar state.

As shown in FIG. 3C, for the cholesteric liquid crystals 131 of the liquid crystal layer 130 to be controlled at the planar state, the first electrode 120 or the second electrode 140 should be split into a plurality of electrodes and then a horizontal electric field should be applied to the split electrodes. However, in the example embodiment, the cholesteric liquid crystals 131 of the liquid crystal layer 130 are only controlled at the homeotropic state and the focal conic state to realize the transparent mode and the light shielding mode. Therefore, in the example embodiment, because the first electrode 120 or the second electrode 140 is not required to be split into a plurality of electrodes to apply the horizontal electric field, the manufacturing process may be simplified, whereby the cost may be reduced.

As described with reference to FIGS. 3A and 3B, according to the example embodiment, the cholesteric liquid crystals 131 of the liquid crystal layer 130 may be controlled at the focal conic state in the light shielding mode, whereby the incident light may be scattered. Also, the cholesteric liquid crystals 131 of the liquid crystal layer 130 may be controlled at the homeotropic state in the transparent mode, whereby the incident light may be transmitted.

If the transparent mode is displayed by the planar state of the cholesteric liquid crystals 131 and the light shielding mode is displayed by the focal conic state of the cholesteric liquid crystals 131, the planar state indicates the transparent mode due to external light reflection, whereby a problem occurs in that a transmittance ratio is deteriorated due to reflection in the transparent mode. To solve the problem that a transmittance ratio is deteriorated in the transparent mode, a method for increasing a light shielding ratio in a light shielding mode without deteriorating the transmittance ratio will be described with reference to FIG. 4.

Figure 4:
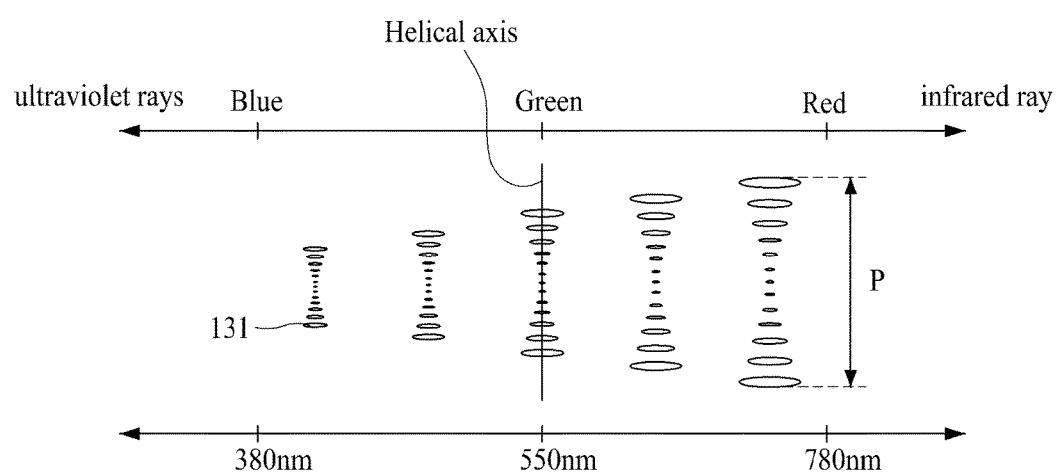
FIG. 4 is an exemplary view illustrating a wavelength range according to a pitch of cholesteric liquid crystals.

A wavelength range of reflective light may be varied depending on a pitch P of the cholesteric liquid crystals 131 arranged in a helical structure by the chiral dopant, as shown in FIG. 4. FIG. 4 is an exemplary view illustrating a wavelength range according to a pitch of cholesteric liquid crystals 131.

As shown in FIG. 4, the pitch P of the cholesteric liquid crystals 131 arranged in a helical structure by the chiral dopant represents a length of a helical axis. The cholesteric liquid crystals 131 is reflected light of a long wavelength if the pitch of the cholesteric liquid crystals 131 arranged in a helical structure by the chiral dopant becomes greater, whereas is the cholesteric liquid crystals 131 is reflected light of a short wavelength if the pitch of the cholesteric liquid crystals 131 becomes smaller. For example, the cholesteric liquid crystals 131 is reflected red-based light having a long wavelength if the pitch of the cholesteric liquid crystals 131 becomes greater, whereas the cholesteric liquid crystals 131 is reflected blue-based light having a short wavelength if the pitch of the cholesteric liquid crystals 131 becomes smaller. That is, light of a corresponding wavelength, which will be reflected by the cholesteric liquid crystals 131, may be determined depending on how the pitch P of the cholesteric liquid crystals 131 arranged in a helical structure by the chiral dopant is designed. The pitch P of the cholesteric liquid crystals 131 arranged in a helical structure may be controlled depending on the amount of the chiral dopant.

If the cholesteric liquid crystals 131 arranged in a helical structure by the chiral dopant reflect light of a visible ray wavelength range, some of visible rays may be reflected and then viewed by a user, whereby a light shielding ratio may be reduced. Also, to increase a light shielding ratio in the light shielding mode without deteriorating a transmittance ratio in the transparent mode, the cholesteric liquid crystals 131 arranged in a helical structure by the chiral dopant may be designed to reflect light of an infrared wavelength range (780 nm or more) or an ultraviolet wavelength range (380 nm or less) not the visible ray wavelength range. The pitch P of the cholesteric liquid crystals 131 arranged in a helical structure by the chiral dopant may be varied depending on a wavelength range. The pitch P of the cholesteric liquid crystals 131 arranged in a helical structure by the chiral dopant may be calculated depending on an average refractive index n of the cholesteric liquid crystals 131 and a reflective wavelength λ of light which is to be reflected, as expressed by the following Equation 1.

$$P = \frac{\lambda}{n} \qquad \text{[Equation 1]}$$

In Equation 1, P represents the pitch of the cholesteric liquid crystals 131 arranged in a helical structure by the chiral dopant, λ represents a reflective wavelength that reflects light, and n represents an average refractive index of the cholesteric liquid crystals 131. For example, if the reflective wavelength λ is 780 nm and the average refractive index n of the cholesteric liquid crystals 131 is 1.5, the pitch P of the cholesteric liquid crystals 131 arranged in a helical structure by the chiral dopant may be calculated as 520 nm. Also, if the reflective wavelength λ is 380 nm and the average refractive index n of the cholesteric liquid crystals 131 is 1.5, the pitch P of the cholesteric liquid crystals 131 arranged in a helical structure by the chiral dopant may be calculated as 253 nm. That is, the pitch P may be designed at 253 nm or less, or 520 nm or more such that the reflective wavelength λ of the cholesteric liquid crystals 131 arranged in a helical structure by the chiral dopant is 780 nm or more and 380 nm or less to reflect the infrared wavelength range (780 nm or more) or the ultraviolet wavelength range (380 nm or less) when the refractive index n of the cholesteric liquid crystals 131 is 1.5.

Figure 5:
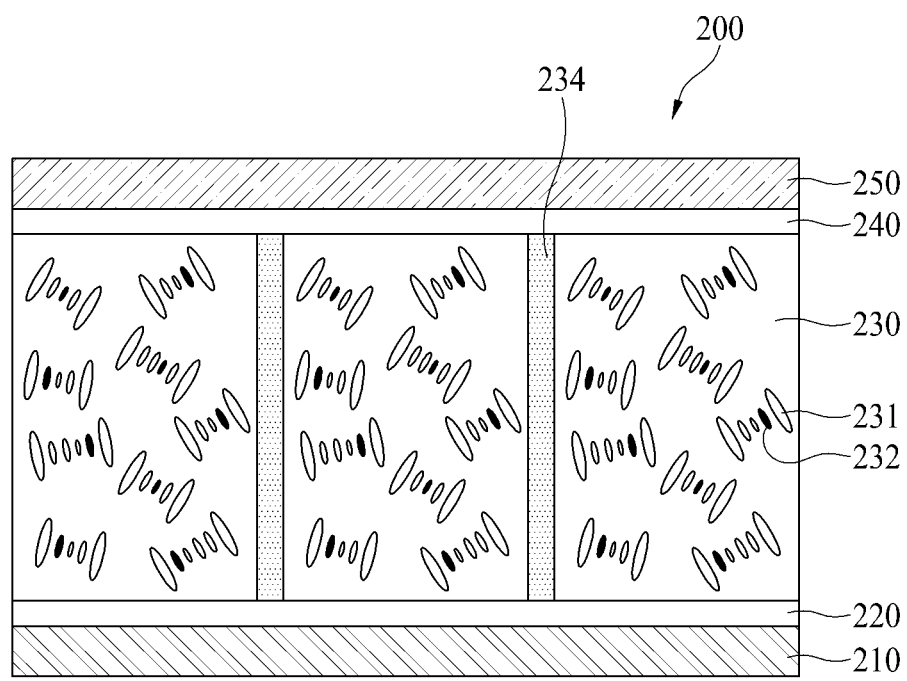
FIG. 5 is a cross-sectional view illustrating a detailed example of a light controlling apparatus of FIG. 1.

FIG. 5 is a cross-sectional view illustrating a detailed example of a light controlling apparatus of FIG. 1. As shown in FIG. 5, a light controlling apparatus 200 according to another example embodiment includes a first substrate 210, a first electrode 220, a liquid crystal layer 230, a second electrode 240, and a second substrate 250.

The first substrate 210, the first electrode 220, the second electrode 240, and the second substrate 250 of FIG. 5 are substantially the same as the first substrate 110, the first electrode 120, the second electrode 140, and the second substrate 150, which are described with reference to FIGS. 1 and 2. Therefore, a detailed description of the first substrate 210, the first electrode 220, the second electrode 240, and the second substrate 250 of FIG. 5 will be omitted.

The liquid crystal layer 230 includes cholesteric liquid crystals 231, dichroic dyes 232, spacers 234, and a chiral dopant or photo-sensitive chiral dopant for arranging the cholesteric liquid crystals 231 and the dichroic dyes 232 in a helical structure. Also, the liquid crystal layer 230 may further include an additive such as a photo-initiator.

The cholesteric liquid crystals 231 may be nematic liquid crystals. The dichroic dyes 232 may be nematic liquid crystals and at the same may be dyes that absorb light. For example, the dichroic dyes 232 may be black dyes that absorb every light of a visible ray wavelength range or dyes that absorb light except a specific colored (for example, red) wavelength and reflect light of the specific colored (for example, red) wavelength. The dichroic dyes 232 may be, but are not limited to, black dyes to increase a light shielding ratio like the example embodiment of the present invention. The cholesteric liquid crystals 231 and the dichroic dyes 232 may be rotated helically by the chiral dopant at the focal conic state, as shown in FIG. 5.

The dichroic dyes 232 may be, but not limited to, a material that includes aluminum zinc oxide (AZO). The dichroic dyes 232 may be included in the liquid crystal layer 230 in the range of 0.5 wt % to 1.5 wt % when a cell gap of the liquid crystal layer 230 is 5 μm to 15 μm. However, the dichroic dyes 232 in an amount smaller than 0.5 wt % may be included in the liquid crystal layer 230 if a light shielding ratio of the dichroic dyes 232 becomes higher. Therefore, the amount of the dichroic dyes 232 may include 0.1 wt % if the light shielding ratio of the dichroic dyes 232 becomes higher. Alternatively, the dichroic dyes 232 in the liquid crystal layer 230 may include more than 1.5 wt % to improve the light shielding ratio if the cell gap of the liquid crystal layer 230 is small. Therefore, if the cell gap is smaller than 5 μm, the dichroic dyes 232 in the crystal layer 230 may adjust 3 wt %. Meanwhile, the dichroic dyes 232 have a predetermined refractive index but their amount in the liquid crystal layer 230 is small, and the dichroic dyes 232 absorb incident light.

Also, the light controlling apparatus may have an increased amount of the dichroic dyes 232 in the liquid crystal layer 230 to increase the light shielding ratio in the light shielding mode. However, in this case, a transmittance ratio may be reduced. Therefore, the amount of the dichroic dyes 232 in the liquid crystal layer 230 may be adjusted considering the light shielding ratio of the light shielding mode and the transmittance ratio of the transparent mode.

Also, the dichroic dyes 232 may easily be discolored by ultraviolet rays (hereinafter, referred to as "UV"). In more detail, a polymer dispersed liquid crystal (PDLC) layer or polymer network liquid crystal (PNLC) layer, which includes the dichroic dyes 232, uses a UV process for hardening a polymer. In this case, the dichroic dyes 232 may become discolored by UV. For example, blue dichroic dyes 232 may be discolored to a purple color by the UV. In this case, because the wavelength range of light absorbed by the dichroic dyes 232 is varied, a problem may occur in that light shielding is performed by a color different from an originally intended color. Also, the dichroic dyes 232 may be damaged by UV, whereby a light absorption ratio of the dichroic dyes 232 may be reduced. As a result, because the light shielding ratio of the light shielding mode of the light controlling apparatus is reduced, the amount of the dichroic dyes 232 should be increased, thereby increasing the cost. Therefore, the liquid crystal layer 230 that includes the dichroic dyes 232 may be configures to not need UV processing.

The spacers 234 are intended to maintain a cell gap of the liquid crystal layer 230. Also, if an external force is applied to the spacers 234, the spacers 234 may protect the inside of the liquid crystal layer 230 and at the same time prevent the first electrode 220 and the second electrode 240 from being shorted by a contact between the first electrode 220 and the second electrode 240. Also, the spacers 234 may serve as barriers that partition the liquid crystal layer 230, the same amount of the cholesteric liquid crystals 231 may be included in each of the partitioned spaces, or the amount of the chiral dopant may be controlled for each of the partitioned spaces to vary the pitch P of the cholesteric liquid crystals 231 arranged in a helical structure by the chiral dopant. If the pitch P of the cholesteric liquid crystals 231 arranged in a helical structure by the chiral dopant is varied, the wavelength range of the light reflected by the cholesteric liquid crystals 231 arranged in a helical structure by the chiral dopant may be controlled as shown in FIG. 4. Each of the spacers 234 may be formed of, but are not limited to, at least one among a photo resist, polydimethylsiloxane, a polymer, and a UV curable polymer, which are transparent materials that may transmit light. Meanwhile, if a cell gap of the liquid crystal layer 230 may be maintained even without the spacers 234, the spacers 234 may be omitted as shown in FIG. 2.

The light controlling apparatus 200 may be realized in a light shielding mode that shields light and a transparent mode that transmits light by controlling voltages applied to the first and second electrodes 220 and 240. Hereinafter, the transparent mode and the light shielding mode of the light controlling apparatus 200 will be described with reference to FIGS. 6A and 6B.

Figure 6A:
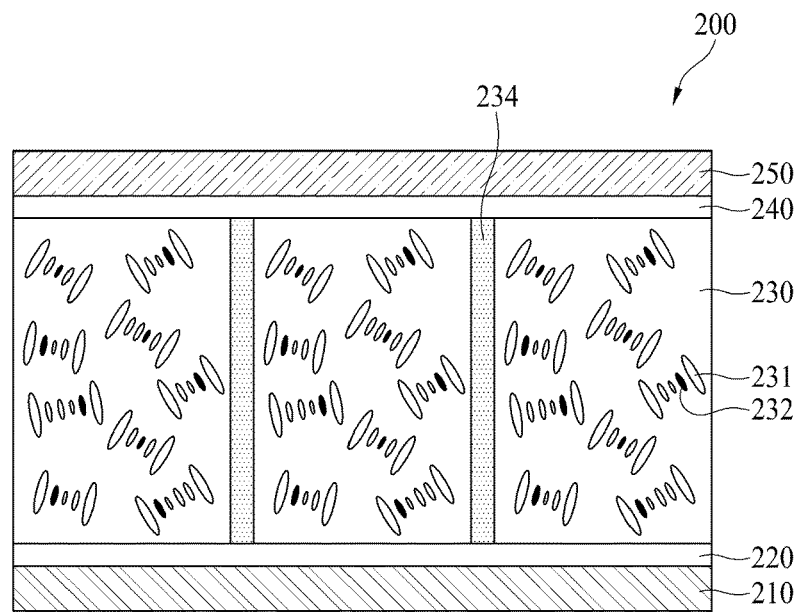
FIGS. 6A and 6B are cross-sectional views illustrating a light controlling apparatus of FIG. 5 in a light shielding mode and a transparent mode.

FIG. 6A is a cross-sectional view illustrating the light controlling apparatus of FIG. 5 in the light shielding mode.

As shown in FIG. 6A, because the light controlling apparatus 200 does not include an alignment film, if no voltage is applied, the cholesteric liquid crystals 231 and the dichroic dyes 232 of the liquid crystal layer 230 have a focal conic state. In more detail, when "no voltage is applied" includes a case where no voltage is applied to the first and second electrodes and a case where a voltage difference between a first voltage applied to the first electrode and a voltage applied to the second electrode is smaller than a first reference voltage. Alternatively, the case where no voltage is applied may include a case where the voltage difference between the first voltage applied to the first electrode and the second voltage applied to the second electrode is smaller than a reference voltage. That is, if no voltage is applied to the first and second electrodes 220 and 240 or a voltage difference between a first voltage V1 applied to the first electrode 220 and a second voltage V2 applied to the second electrode 240 is smaller than the first reference voltage, the cholesteric liquid crystals 231 and the dichroic dyes 232 of the liquid crystal layer 230 have the focal conic state. At the focal conic state, the cholesteric liquid crystals 231 and the dichroic dyes 232 have the state that they are rotated helically by the chiral dopant as shown in FIG. 6A. Also, the cholesteric liquid crystals 231 and the dichroic dyes 232, which are arranged in a helical structure by the chiral dopant, are arranged randomly as shown in FIG. 6A.

In this case, light incident upon the liquid crystal layer 230 is scattered by the cholesteric liquid crystals 231 as shown in FIG. 6A or absorbed by the dichroic dyes 232. If the dichroic dyes 232 are black dyes, the liquid crystal layer 230 may shield the incident light by displaying a black color in the light shielding mode. Therefore, the cholesteric liquid crystals 231 and the dichroic dyes 232 of the liquid crystal layer 230 may be controlled to have the focal conic state in the light shielding mode, whereby a rear background of the light controlling apparatus may not be displayed.

As described with reference to FIG. 6A, power consumption is not required to realize the light shielding mode because the light shielding mode may be realized when no voltage is applied.

Also, because the liquid crystal layer 230 has a focal conic state that the cholesteric liquid crystals 231 and the dichroic dyes 232, which are arranged in a helical structure by the chiral dopant, are arranged randomly at an initial state that no voltage is applied, the light controlling apparatus 200 does not need an alignment film for aligning the cholesteric liquid crystals 231. Therefore, the manufacturing process may be simplified, thereby reducing manufacturing cost.

Figure 6B:
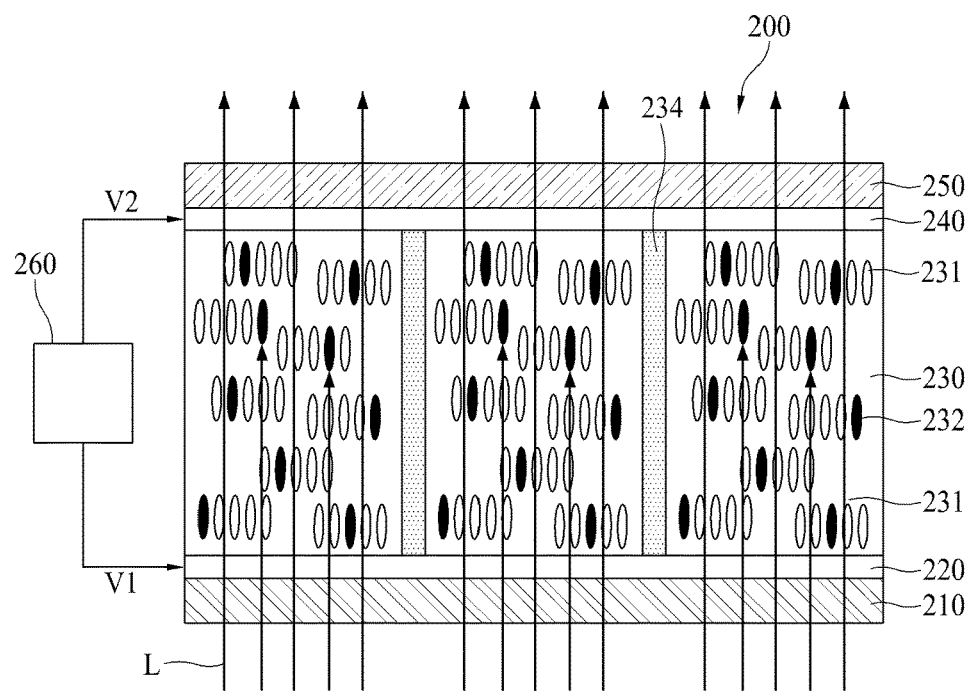

FIG. 6B is a cross-sectional view illustrating the light controlling apparatus of FIG. 5 in the transparent mode.

As shown in FIG. 6B, if a voltage is applied, that is, if the first voltage V1 is applied to the first electrode 220 and the second voltage V2 is applied to the second electrode 240, the cholesteric liquid crystals 231 and the dichroic dyes 232 of the liquid crystal layer 230 have at a homeotropic state by a vertical electric field (y-axis directional electric field). At the homeotropic state, the cholesteric liquid crystals 231 rotated helically by the chiral dopant and the dichroic dyes 232 may be arranged in a vertical direction (y-axis direction) as shown in FIG. 6B.

In this case, because the cholesteric liquid crystals 231 are arranged in an incident direction of light, scattering of light incident upon the liquid crystal layer 230 is minimized. Therefore, most of light incident upon the light controlling apparatus 200 may pass through the liquid crystal layer 230.

For the cholesteric liquid crystals 231 and the dichroic dyes 232 of the liquid crystal layer 230 to have the homeotropic state by the vertical electric field, the voltage should be applied, and especially the voltage difference between the first voltage V1 applied to the first electrode 220 and the second voltage V2 applied to the second electrode 240 should be greater than a second reference voltage. Alternatively, the voltage difference between the first voltage V1 applied to the first electrode 220 and the second voltage V2 applied to the second electrode 240 may be greater than a reference voltage. Particularly, in the example embodiment, because the vertical electric field is required such that the cholesteric liquid crystals 231 and the dichroic dyes 232 of the liquid crystal layer 230 are maintained at the homeotropic state, the first voltage V1 should continuously be applied to the first electrode 220, and the second voltage V2 should continuously be applied to the second electrode 240.

Meanwhile, if the liquid crystal layer including dyes does not include a polymer, it is difficult to realize scattering due to absence of the polymer, whereby only light absorbed by the dyes of the liquid crystal layer is shielded in the light shielding mode. Therefore, a rear background of the liquid crystal layer including dyes is displayed as it is, whereby a problem occurs in that light shielding ratio is reduced. To solve this problem, if the amount of the dyes is increased to increase the light shielding ratio of the liquid crystal layer, a problem occurs in that a transmittance ratio in the transparent mode is reduced.

In the example embodiment, because the cholesteric liquid crystals 231 rotated helically by the chiral dopant and the dichroic dyes 232 are arranged randomly at the focal conic state in case of the light shielding mode, the incident light is scattered by the cholesteric liquid crystals 231. If the incident light is scattered, a light path becomes longer, whereby it is likely that the light is again scattered by the cholesteric liquid crystals 231 or absorbed by the dichroic dyes 232. Therefore, in the example embodiment, the light shielding ratio may be increased in the light shielding mode by light scattering of the cholesteric liquid crystals 231 and light absorption of the dichroic dyes 232, instead of the liquid crystal layer that includes dyes but does not include a polymer. Also, in the example embodiment, because the amount of the dichroic dyes 232 may be reduced as compared with the liquid crystal layer that does not include a polymer, light absorption of the dichroic dyes 232 may be minimized so that the transmittance ratio may be increased in the transparent mode as compared to a liquid crystal layer that includes dyes but does not include a polymer.

Meanwhile, the cholesteric liquid crystals 231 and the dichroic dyes 232 of the liquid crystal layer 230 may have a planar state that helical axes of the cholesteric liquid crystals 231 are arranged in a vertical direction (y-axis direction) as shown in FIG. 3C. In For the cholesteric liquid crystals 231 and the dichroic dyes 232 to be controlled at the planar state, the first electrode 220 or the second electrode 240 should be split into a plurality of electrodes and then a horizontal electric field should be applied to the split electrodes. However, in the example embodiment, the cholesteric liquid crystals 231 and the dichroic dyes 232 are only controlled at the homeotropic state and the focal conic state to realize the transparent mode and the light shielding mode. Therefore, in the example embodiment, because the first electrode 220 or the second electrode 240 is not required to be split into a plurality of electrodes to apply the horizontal electric field, the manufacturing process may be simplified, thereby reducing manufacturing cost.

As described with reference to FIGS. 6A and 6B, according to the example embodiment, the cholesteric liquid crystals 231 and the dichroic dyes 232 of the liquid crystal layer 230 may be controlled at the focal conic state in the light shielding mode, whereby the incident light may be scattered or the incident light may be absorbed by the dichroic dyes 232. Also, the cholesteric liquid crystals 231 and the dichroic dyes 232 of the liquid crystal layer 230 may be controlled at the homeotropic state in the transparent mode, whereby the incident light may be transmitted. Also, the pitch of the cholesteric liquid crystals 231 and the dichroic dyes 232, which are arranged in a helical structure, is applied to reflect the light of infrared wavelength range or ultraviolet wavelength range, whereby the transmittance ratio may not be deteriorated in the transparent mode and the light shielding ratio may be increased in the light shielding mode. Also, as the planar state of the cholesteric liquid crystals is not applied, loss of the transmittance ratio, which is caused by reflection in the transparent mode, may be reduced.

Figure 7:
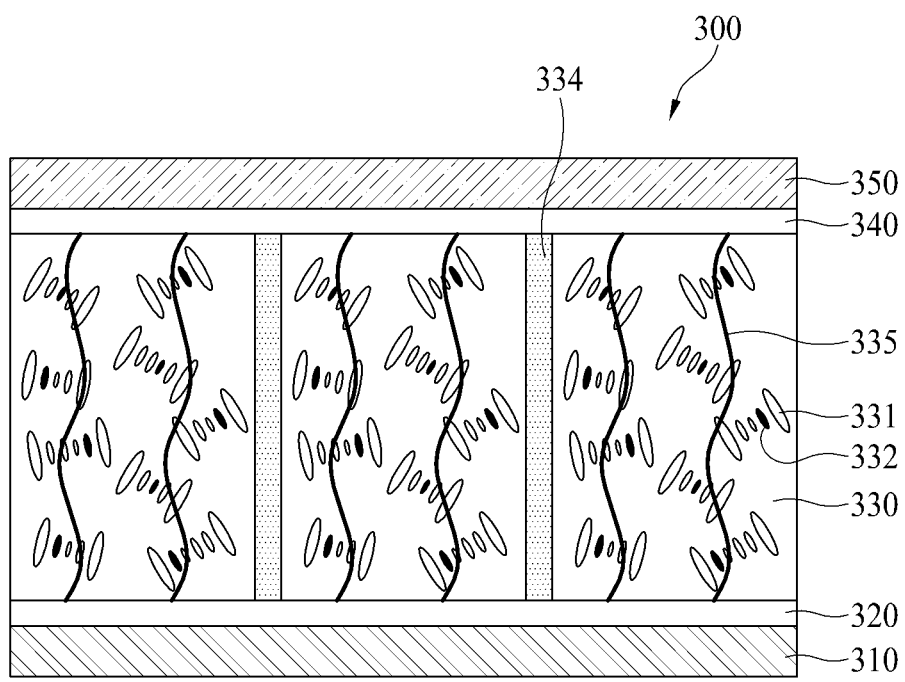
FIG. 7 is an exemplary view illustrating another detailed example of a light controlling apparatus of FIG. 1.

FIG. 7 is a cross-sectional view illustrating a detailed example of a light controlling apparatus of FIG. 1. As shown in FIG. 7, a light controlling apparatus 300 according to still another example embodiment of the present invention includes a first substrate 310, a first electrode 320, a liquid crystal layer 330, a second electrode 340, and a second substrate 350.

The first substrate 310, the first electrode 320, the second electrode 340, and the second substrate 350 of FIG. 7 are substantially the same as the first substrate 110, the first electrode 120, the second electrode 140, and the second substrate 150, which are described with reference to FIGS. 1 and 2. Therefore, a detailed description of the first substrate 310, the first electrode 320, the second electrode 340, and the second substrate 350 of FIG. 7 will be omitted.

The liquid crystal layer 330 includes cholesteric liquid crystals 331, dichroic dyes 332, spacers 334, polymer networks 335, and a chiral dopant or photo-sensitive chiral dopant for arranging the cholesteric liquid crystals 331 and the dichroic dyes 332 in a helical structure. Also, the liquid crystal layer 330 may further include an additive such as a photo-initiator.

The cholesteric liquid crystals 331 may be nematic liquid crystals. The dichroic dyes 332 may be nematic liquid crystals and at the same may be dyes that absorb light. For example, the dichroic dyes 332 may be black dyes that absorb light across the visible ray wavelength range or dyes that absorb light except a specific color (for example, red) wavelength and reflect light of the specific color (for example, red) wavelength. Here, the dichroic dyes 332 may be, but not limited to, black dyes to increase a light shielding ratio.

The cholesteric liquid crystals 331 and the dichroic dyes 332 may be rotated helically by the chiral dopant at the focal conic state, as shown in FIG. 7. The spacers 334 of FIG. 7 are substantially the same as those 234 described with reference to FIG. 2. Therefore, a detailed description of the spacers 334 of FIG. 7 will be omitted.

The polymer networks 335 may be formed by mixing a monomer with the liquid crystal layer 330 and UV hardening the mixture of the monomer and the liquid crystal layer 330, and have a structure that a polymer is formed in a shape of a net. The polymer networks 335 may be formed to have a refractive index similar to a short-axial refractive index of the cholesteric liquid crystals 331. For example, if the liquid crystal layer 330 includes the cholesteric liquid crystals 331 of which refractive index is 1.4, a monomer which will be used as a material of the polymer networks 335 may be one of various compounds or materials, of which refractive index is 1.4.

The polymer networks 335 may scatter incident light. Therefore, the liquid crystal layer 330 that includes the polymer networks 335 may scatter the incident light more than the liquid crystal layer 330 that does not include the polymer networks 335. For this reason, a path of light incident upon the liquid crystal layer 330 that includes the polymer networks 335 becomes longer than that of light incident upon the liquid crystal layer 330 that does not include the polymer networks 335. Therefore, it is likely that the light incident upon the liquid crystal layer 330 that includes the polymer networks 335 is absorbed by the dichroic dyes 332. As a result, if the liquid crystal layer includes the polymer networks 335 in a similar manner, the light shielding ratio may be increased as compared to light shielding ratio performed without the polymer networks 335.

The light controlling apparatus 300 according to the embodiment of the present invention may be realized in a light shielding mode shielding light or a transparent mode transmitting light by controlling voltages applied to the first and second electrodes 320 and 340. Hereinafter, the transparent mode and the light shielding mode of the light controlling apparatus 300 will be described with reference to FIGS. 8A and 8B.

Figure 8A:
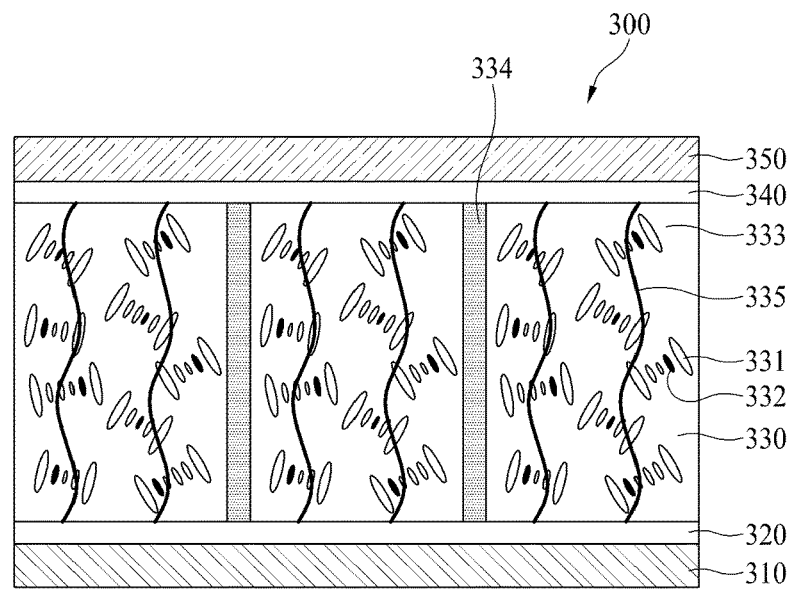
FIGS. 8A and 8B are cross-sectional views illustrating a light controlling apparatus of FIG. 7 in a light shielding mode and a transparent mode.
Figure 8B:
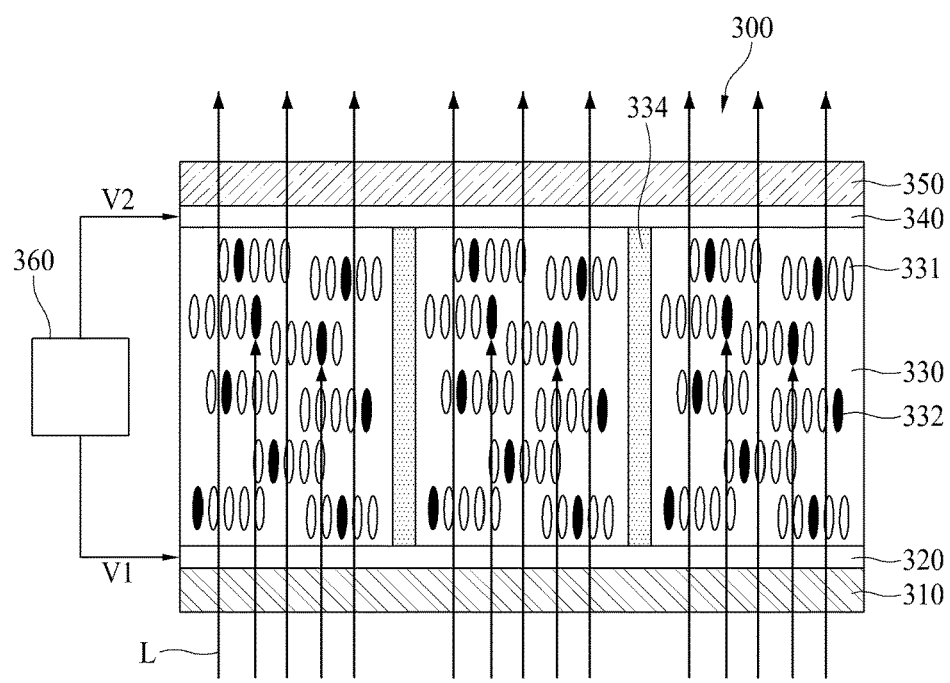

FIG. 8A is a cross-sectional view illustrating the light controlling apparatus of FIG. 7 in the light shielding mode, and FIG. 8B is a cross-sectional view illustrating the light controlling apparatus of FIG. 7 in the transparent mode.

As shown in FIG. 8A, if no voltage is applied to the light controlling apparatus 300, the cholesteric liquid crystals 331 and the dichroic dyes 332 of the liquid crystal layer 330 have the focal conic state, whereby the light controlling apparatus 300 does not include an alignment film for aligning the cholesteric liquid crystals 331 and the dichroic dyes 332. That is, a case where "no voltage is applied" may include a case where no voltage is applied to the first and second electrodes 320 and 340 or a case where a voltage difference between a first voltage V1 applied to the first electrode 320 and a second voltage V2 applied to the second electrode 340 is smaller than a first reference voltage. Alternatively, the case where no voltage is applied includes a case where the voltage difference between the first voltage V1 applied to the first electrode 320 and the second voltage V2 applied to the second electrode 340 is smaller than a reference voltage. At the focal conic state, the cholesteric liquid crystals 331 and the dichroic dyes 332 have the state that they are rotated helically by the chiral dopant as shown in FIG. 8A. Also, the cholesteric liquid crystals 331 and the dichroic dyes 332, which are arranged in a helical structure by the chiral dopant, are arranged randomly as shown in FIG. 8A.

In this case, light incident upon the liquid crystal layer 330, as shown in FIG. 8A, is scattered by the liquid crystals 331 and the polymer networks 335 or absorbed by the dichroic dyes 332. If the dichroic dyes 332 are black dyes, the liquid crystal layer 330 may shield the incident light by displaying a black color in the light shielding mode. Therefore, the cholesteric liquid crystals 331 and the dichroic dyes 332 of the liquid crystal layer 330 may be controlled to have the focal conic state in the light shielding mode such that a rear background of the light controlling apparatus 300 is not displayed.

As described with reference to FIG. 8A, power consumption is not required to realize the light shielding mode because the light shielding mode may be realized if no voltage is applied.

Also, because the liquid crystal layer 330 has the focal conic state that the cholesteric liquid crystals 331 and the dichroic dyes 332, which are arranged in a helical structure by the chiral dopant, are arranged randomly at an initial state that no voltage is applied, the light controlling apparatus 300 does not need an alignment film for aligning the cholesteric liquid crystals 331 and the dichroic dyes 332. Therefore, the manufacturing process may be simplified, thereby reducing manufacturing cost.

As shown in FIG. 8B, if a voltage is applied, that is, if the first voltage V1 is applied to the first electrode 320 and the second voltage V2 is applied to the second electrode 340, the cholesteric liquid crystals 331 and the dichroic dyes 332 of the liquid crystal layer 330 have a homeotropic state by a vertical electric field (y-axis directional electric field). At the homeotropic state, the cholesteric liquid crystals 331 and the dichroic dyes 332, which are rotated helically by the chiral dopant, may be arranged in a vertical direction (y-axis direction) as shown in FIG. 8B.

At this time, because the cholesteric liquid crystals 331 are arranged in an incident direction of light, scattering of light incident upon the liquid crystal layer 330 is minimized. Therefore, most of the light incident upon the light controlling apparatus 300 may pass through the liquid crystal layer 330.

For the cholesteric liquid crystals 331 and the dichroic dyes 332 of the liquid crystal layer 330 to have the homeotropic state by the vertical electric field, the voltage should be applied, and especially the voltage difference between the first voltage V1 applied to the first electrode 320 and the second voltage V2 applied to the second electrode 340 should be greater than a second reference voltage. Alternatively, the case where the voltage is applied may include a case where the voltage difference between the first voltage V1 applied to the first electrode 320 and the second voltage V2 applied to the second electrode 340 is more than a reference voltage. Particularly, because the vertical electric field is provided such that the cholesteric liquid crystals 331 and the dichroic dyes 332 of the liquid crystal layer 330 are maintained at the homeotropic state, the first voltage V1 should continuously be applied to the first electrode 320, and the second voltage V2 should continuously be applied to the second electrode 340.

It is assumed that the light shielding mode has a transmittance ratio of the light controlling apparatus 300 that is smaller than a % while the transparent mode has a transmittance ratio of the light controlling apparatus 300 that is greater than b %. The transmittance ratio of the light controlling apparatus 300 represents a ratio of output light to light incident upon the light controlling apparatus 300. For example, a % may be 10% to 50%, and b % may be 60% to 90%.

In this case, if no voltage is applied to the first and second electrodes 320 and 340, or if the voltage difference between the first voltage V1 applied to the first electrode 320 and the second voltage V2 applied to the second electrode 340 is smaller than the first reference voltage, the light controlling apparatus 300 is realized in the light shielding mode in which the transmittance ratio of the light controlling apparatus 300 is smaller than a %. If the voltage difference between the first voltage V1 applied to the first electrode 320 and the second voltage V2 applied to the second electrode 340 is greater than the second reference voltage, the light controlling apparatus 300 is realized in the transparent mode in which the transmittance ratio of the light controlling apparatus 300 is greater than b %. If the voltage difference between the first voltage V1 applied to the first electrode 320 and the second voltage V2 applied to the second electrode 340 is more than the first reference voltage and less than the second reference voltage, the transmittance ratio of the light controlling apparatus 300 is neither smaller than a % nor greater than b %, whereby both the transparent mode and the light shielding mode are not satisfied.

Meanwhile, although the second reference voltage may be greater than the first reference voltage, the second reference voltage may be substantially the same as the first reference voltage. In this case, a reference transmittance ratio of the light shielding mode and a reference transmittance ratio of the transparent mode may be set to c % equally. For example, if the voltage difference between the first voltage V1 applied to the first electrode 320 and the second voltage V2 applied to the second electrode 340 is smaller than the reference voltage, the light controlling apparatus 300 is realized in the light shielding mode in which the transmittance ratio of the light controlling apparatus 300 is smaller than c %. If the voltage difference between the first voltage V1 applied to the first electrode 320 and the second voltage V2 applied to the second electrode 340 is more than the reference voltage, the light controlling apparatus 300 is realized in the transparent mode in which the transmittance ratio of the light controlling apparatus 100 is equal to or greater than c %. For example, c % may be 10% to 50%.

Meanwhile, the cholesteric liquid crystals 331 and the dichroic dyes 332 of the liquid crystal layer 330 may have a planar state in which helical axes of the cholesteric liquid crystals 331 and the dichroic dyes 332 are arranged in a vertical direction (y-axis direction) as shown in FIG. 3C. For the cholesteric liquid crystals 331 and the dichroic dyes 332 to be controlled at the planar state, the first electrode 320 or the second electrode 340 should be split into a plurality of electrodes and then a horizontal electric field should be applied to the split electrodes. However, in the example embodiment, the cholesteric liquid crystals 331 and the dichroic dyes 332 are only controlled at the homeotropic state and the focal conic state to realize the transparent mode and the light shielding mode. Therefore, because the first electrode 320 or the second electrode 340 is not required to be split into a plurality of electrodes to apply the horizontal electric field, the manufacturing process may be simplified, thereby reducing manufacturing cost.

As described with reference to FIGS. 8A and 8B, the cholesteric liquid crystals 331 and the dichroic dyes 332 of the liquid crystal layer 330 may be controlled at the focal conic state in the light shielding mode, whereby the incident light may be scattered. Also, the cholesteric liquid crystals 331 and the dichroic dyes 332 of the liquid crystal layer 330 may be controlled at the homeotropic state in the transparent mode, whereby the incident light may be transmitted.

Figure 9A:
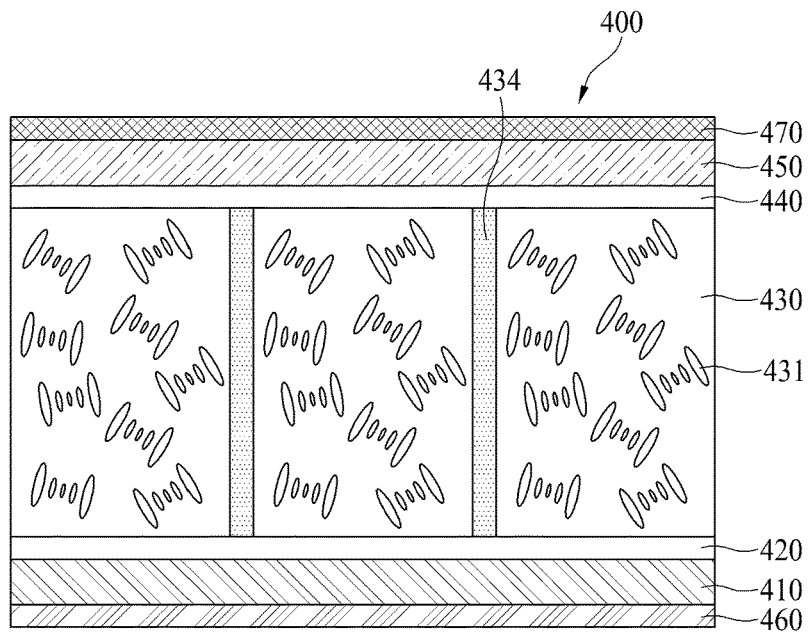
FIGS. 9A to 9C are cross-sectional views illustrating still other detailed examples of a light controlling apparatus of FIG. 1.
Figure 9B:
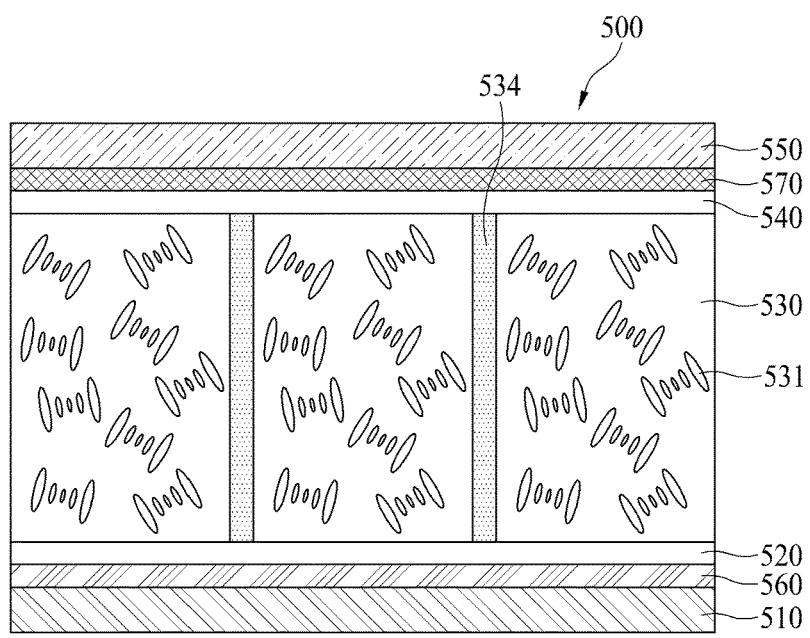
Figure 9C:
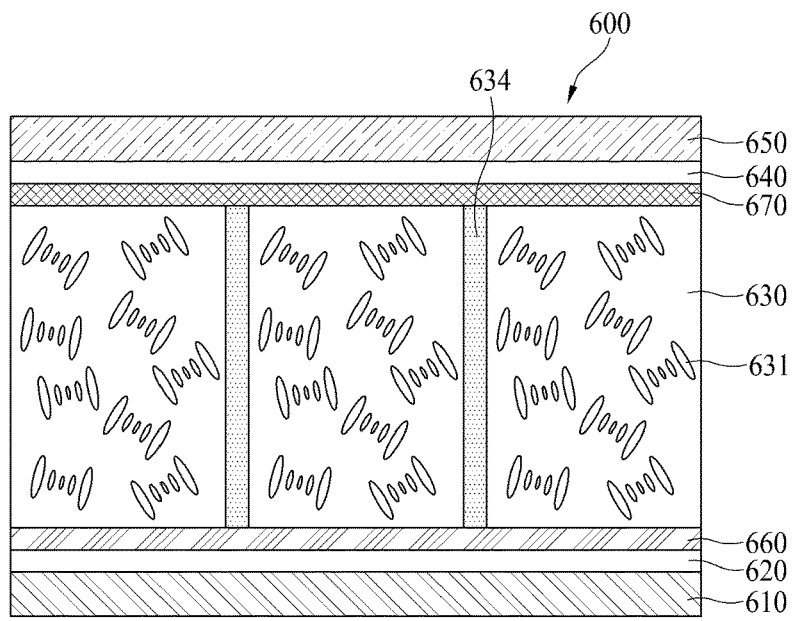

The light controlling apparatus may further include refractive index matching layers as shown in FIGS. 9A to 9C. Hereinafter, the light controlling apparatus that further includes refractive index matching layers will be described in detail with reference to FIGS. 9A to 9C.

FIG. 9A is a cross-sectional view illustrating still another detailed example of a light controlling apparatus of FIG. 1.

As shown in FIG. 9A, a light controlling apparatus 400 according to still another embodiment of the present invention includes a first substrate 410, a first electrode 420, a liquid crystal layer 430, a second electrode 440, a second substrate 450, a first refractive index matching layer 460, and a second refractive index matching layer 470.

The first substrate 410, the first electrode 420, the liquid crystal layer 430, the second electrode 440 and the second substrate 450 of FIG. 9A are substantially the same as the first substrate 110, the first electrode 120, the liquid crystal layer 130, the second electrode 140, and the second substrate 150, which are described with reference to FIGS. 1 and 2. Therefore, a detailed description of the first substrate 410, the first electrode 420, the liquid crystal layer 430, the second electrode 440 and the second substrate 450 of FIG. 9A will be omitted.

The first refractive index matching layer 460 may be provided on an opposite surface of one surface of the first substrate 410, on which the first electrode 420 is provided. That is, the first electrode 420 may be provided on one surface of the first substrate 410, and the first refractive index matching layer 460 may be provided on the other surface corresponding to the opposite surface of the one surface of the first substrate 410.

Fresnel reflection may be generated due to a difference in a refractive index between the air and the first substrate 410. For example, if there is a difference in a refractive index between the air and the first substrate 410, the light entering the first substrate 410 through the air may be reflected due to the difference in a refractive index between the air and the first substrate 410. Therefore, the first refractive index matching layer 460 may have a refractive index between the air and the first substrate 410 to reduce the difference in a refractive index between the air and the first substrate 410. For example, if the refractive index of the air is 1 and the refractive index of the first substrate 410 is 1.6, the first refractive index matching layer 460 may have a refractive index between 1.1 and 1.5 to reduce the difference in a refractive index between the air and the first substrate 410.

The second refractive index matching layer 470 may be provided on an opposite surface of one surface of the second substrate 450, on which the second electrode 440 is provided. That is, the second electrode 440 may be provided on one surface of the second substrate 450, and the second refractive index matching layer 470 may be provided on the other surface corresponding to the opposite surface of the one surface of the second substrate 450.

Fresnel reflection may be generated due to a difference in a refractive index between the air and the second substrate 450. For example, if there is a difference in a refractive index between the air and the second substrate 450, the light entering the second substrate 450 may partially be reflected due to the difference in a refractive index between the air and the second substrate 450 when entering the air. Therefore, the second refractive index matching layer 470 may have a refractive index between the air and the second substrate 450 to reduce the difference in a refractive index between the air and the second substrate 450. For example, if the refractive index of the air is 1 and the refractive index of the second substrate 450 is 1.6, the second refractive index matching layer 470 may have a refractive index between 1.1 and 1.5 to reduce the difference in a refractive index between the air and the second substrate 450.

Each of the first and second refractive index matching layers 460 and 470 may be made of a transparent adhesive film such as an optically clear adhesive (OCA), an organic compound adhesive that enables thermal hardening or UV hardening, etc.

FIG. 9B is a cross-sectional view illustrating still another example of a light controlling apparatus of FIG. 1.

As shown in FIG. 9B, a light controlling apparatus 500 according to still another embodiment of the present invention includes a first substrate 510, a first electrode 520, a liquid crystal layer 530, a second electrode 540, a second substrate 550, a first refractive index matching layer 560, and a second refractive index matching layer 570.

The first substrate 510, the first electrode 520, the liquid crystal layer 530, the second electrode 540 and the second substrate 550 of FIG. 9B are substantially the same as the first substrate 110, the first electrode 120, the liquid crystal layer 130, the second electrode 140, and the second substrate 150, which are described with reference to FIGS. 1 and 2. Therefore, a detailed description of the first substrate 510, the first electrode 520, the liquid crystal layer 530, the second electrode 540 and the second substrate 550 of FIG. 9B will be omitted.

The first refractive index matching layer 560 may be provided between the first substrate 510 and the first electrode 520. Fresnel reflection may be generated due to a difference in a refractive index between the first substrate 510 and the first electrode 520. For example, if there is a difference in a refractive index between the first substrate 510 and the first electrode 520, the light that has passed through the first substrate 510 may partially be reflected due to the difference in a refractive index between the first substrate 510 and the first electrode 520 when entering the first electrode 520. Therefore, the first refractive index matching layer 560 may have a refractive index between the first substrate 510 and the first electrode 520 to reduce the difference in a refractive index between the first substrate 510 and the first electrode 520. For example, if the refractive index of the first substrate 510 is 1.6 and the refractive index of the first electrode 520 is 2, the first refractive index matching layer 560 may have a refractive index between 1.7 and 1.9 to reduce the difference in a refractive index between the first substrate 510 and the first electrode 520.

The second refractive index matching layer 570 may be provided between the second substrate 550 and the second electrode 540. Fresnel reflection may be generated due to a difference in a refractive index between the second substrate 550 and the second electrode 540. For example, if there is a difference in a refractive index between the second substrate 550 and the second electrode 540, the light that has passed through the second electrode 540 may partially be reflected due to the difference in a refractive index between the second substrate 550 and the second electrode 540 when entering the second substrate 550. Therefore, the second refractive index matching layer 570 may have a refractive index between the second substrate 550 and the second electrode 540 to reduce the difference in a refractive index between the second substrate 550 and the second electrode 540. For example, if the refractive index of the second substrate 550 is 1.6 and the refractive index of the second electrode 540 is 2, the second refractive index matching layer 570 may have a refractive index between 1.7 and 1.9 to reduce the difference in a refractive index between the second substrate 550 and the second electrode 540.

Each of the first and second refractive index matching layers 560 and 570 may be made of a transparent adhesive film such as an optically clear adhesive (OCA), an organic compound adhesive that enables thermal hardening or UV hardening, etc.

FIG. 9C is a cross-sectional view illustrating still another example of a light controlling apparatus of FIG. 1.

As shown in FIG. 9C, a light controlling apparatus 600 according to still another example embodiment includes a first substrate 610, a first electrode 620, a liquid crystal layer 630, a second electrode 640, a second substrate 650, a first refractive index matching layer 660, and a second refractive index matching layer 670.

The first substrate 610, the first electrode 620, the liquid crystal layer 630, the second electrode 640 and the second substrate 650 of FIG. 9C are substantially the same as the first substrate 110, the first electrode 120, the liquid crystal layer 130, the second electrode 140, and the second substrate 150, which are described with reference to FIGS. 1 and 2. Therefore, a detailed description of the first substrate 610, the first electrode 620, the liquid crystal layer 630, the second electrode 640 and the second substrate 650 of FIG. 9C will be omitted.

The first refractive index matching layer 660 may be provided between the first electrode 620 and the liquid crystal layer 630. Fresnel reflection may be generated due to a difference in a refractive index between the first electrode 620 and the liquid crystal layer 630. For example, if there is a difference in a refractive index between the first electrode 620 and the liquid crystal layer 630, the light that has passed through the first electrode 620 may partially be reflected due to the difference in a refractive index between the first electrode 620 and the liquid crystal layer 630 when entering the liquid crystal layer 630. Therefore, the first refractive index matching layer 660 may have a refractive index between the first electrode 620 and the liquid crystal layer 630 to reduce the difference in a refractive index between the first electrode 620 and the liquid crystal layer 630.

The second refractive index matching layer 670 may be provided between the second electrode 640 and the liquid crystal layer 630. Fresnel reflection may be generated due to a difference in a refractive index between the second electrode 640 and the liquid crystal layer 630. For example, if there is a difference in a refractive index between the second electrode 640 and the liquid crystal layer 630, the light that has passed through the second electrode 640 may partially be reflected due to the difference in a refractive index between the second electrode 640 and the liquid crystal layer 630 when entering the liquid crystal layer 630. Therefore, the second refractive index matching layer 670 may have a refractive index between the second electrode 640 and the liquid crystal layer 630 to reduce the difference in a refractive index between the second electrode 640 and the liquid crystal layer 630.

Each of the first and second refractive index matching layers 660 and 670 may be made of a transparent adhesive film such as an optically clear adhesive (OCA), an organic compound adhesive that enables thermal hardening or UV hardening, etc.

[Transparent Display Device]

Figure 10:
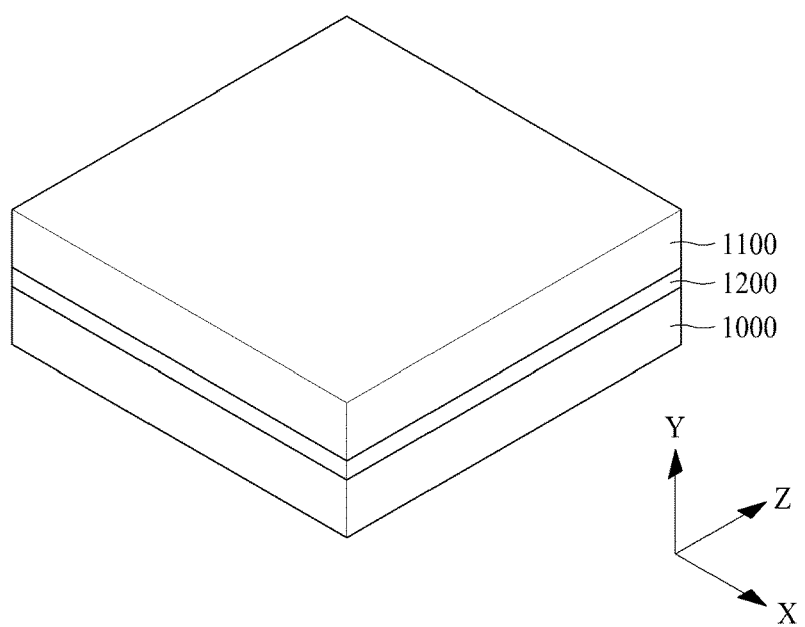
FIG. 10 is a perspective view illustrating a transparent display device according to one embodiment of the present invention.

FIG. 10 is a perspective view illustrating a transparent display device according to another example embodiment. As shown in FIG. 10, the transparent display device includes a light controlling apparatus 1000, a transparent display panel 1100, and an adhesive layer 1200.

The light controlling apparatus 1000 may be realized as any one of the light controlling apparatuses 100, 200, 300, 400, 500 and 600 according to the embodiments described with reference to FIGS. 1, 2, 3A to 3C, 4, 5, 6A, 6B, 7, 8A, 8B, and 9A to 9C. Therefore, the light controlling apparatus 1000 may shield the incident light in the light shielding mode and transmit the incident light in the transparent mode. The light controlling apparatus 1000 may allow its rear background not to be displayed by displaying a specific color in accordance with chroic dyes, whereby the light controlling apparatus 1000 may be realized to provide a user with esthetic effect in addition to a light shielding function.

Figure 11A:
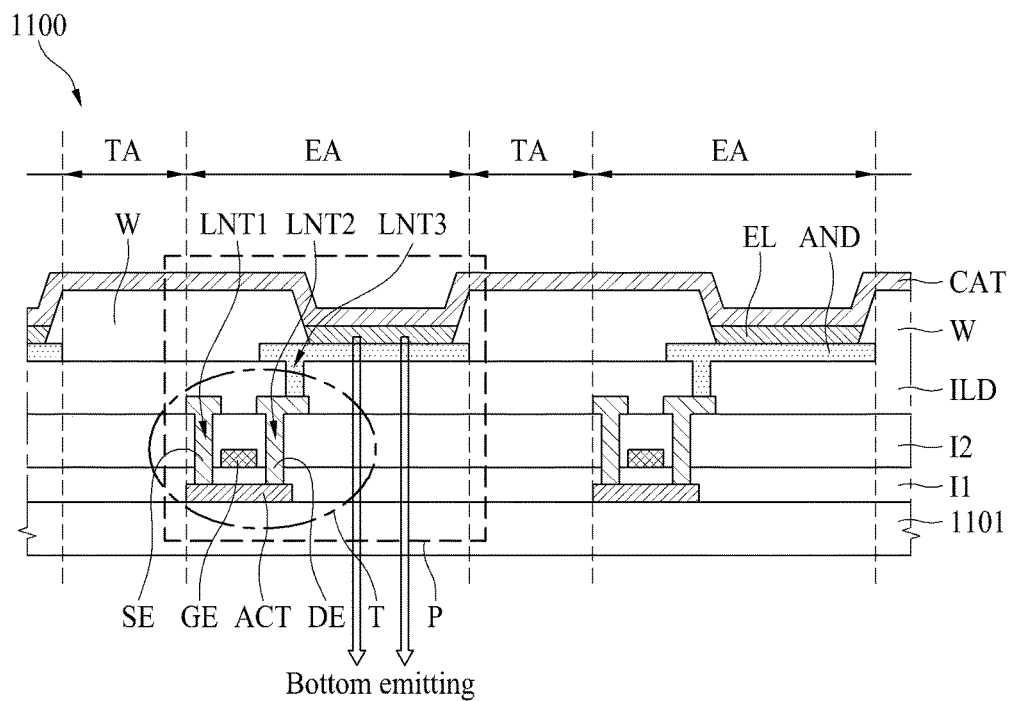
FIG. 11A is a cross-sectional view illustrating a detailed example of a lower substrate of a transparent display panel of FIG. 10.
Figure 11B:
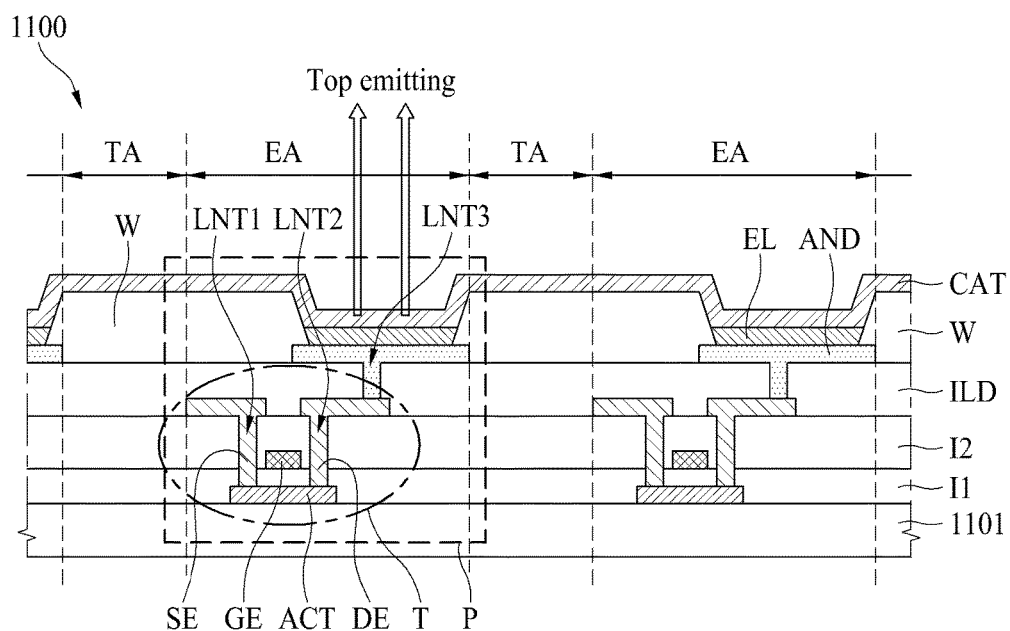
FIG. 11B is a cross-sectional view illustrating another example of a lower substrate of a transparent display panel of FIG. 10.

FIG. 11A is a cross-sectional view illustrating an example of a lower substrate of a transparent display panel of FIG. 10. FIG. 11B is a cross-sectional view illustrating another example of a lower substrate of a transparent display panel of FIG. 10.

As shown in FIGS. 11A and 11B, the transparent display panel 1100 includes a transmissive area TA and an emissive area EA in one sub pixel area. The emissive area EA indicates an area where an actual image is displayed, and the transmissive area TA indicates an area where external light is transmitted to the transparent display panel. Therefore, if the transparent display panel is not driven, the user may watch a background of the transparent display panel, that is, an object of a rear side or rear background of the transparent display panel. Alternatively, if the transparent display panel is driven, the user may simultaneously watch the actual image of the emissive area EA and a background through the transmissive area TA. An area ratio of the emissive area EA and the transmissive area TA in the sub pixel area may be set variously in view of visibility and a transmittance ratio.

Pixels P displaying an image are provided in the emissive area EA. Each of the pixels P may be provided with a transistor device T, an anode electrode AND, an organic layer EL, and a cathode electrode CAT as shown in FIGS. 11A and 11B.

The transistor device T includes an active layer ACT provided on a lower substrate 1101, a first insulating film I1 provided on the active layer ACT, a gate electrode GE provided on the first insulating film I1, a second insulating film I2 provided on the gate electrode GE, and source and drain electrodes SE and DE provided on the second insulating film I2 and connected to the active layer ACT through first and second contact holes CNT1 and CNT2. Although the transistor device T is formed in a top gate type in FIGS. 11A and 11B, the transistor device T may be formed in a bottom gate type without limitation to the top gate type.

The anode electrode AND is connected to the drain electrode DE of the transistor device T through a third contact hole CNT3 that passes through an inter layer dielectric ILD provided on the source and drain electrodes SE and DE. A barrier is provided between the anode electrodes AND adjacent to each other, whereby the anode electrodes AND adjacent to each other may be insulated electrically.

The organic layer EL is provided on the anode electrode AND. The organic layer El may include a hole transporting layer, an organic light emitting layer, and an electrode transporting layer.

The cathode electrode CAT is provided on the organic layer EL and the barrier W. If a voltage is applied to the anode electrode AND and the cathode electrode CAT, holes and electrons are moved to an organic light emitting layer through the hole transporting layer and the electron transporting layer and combined with each other in the organic light emitting layer to emit light.

The transparent display panel 1100 is formed in a bottom emission type in FIG. 11A. If the transparent display panel 1100 is formed in a bottom emission type, light is emitted toward the lower substrate 1101. Therefore, the light controlling apparatus 1000 may be arranged on an upper substrate.

In the bottom emission type, because light of the organic layer EL is emitted toward the lower substrate 1101, the transistor T may be provided below the barrier W to reduce luminance reduction caused by the transistor T. Also, in the bottom emission type, the anode electrode AND may be formed of a transparent metal material, such as ITO and IZO, and the cathode electrode CAT may be formed of a metal material having high reflectivity, such as aluminum or a structure having aluminum and ITO. To improve the transmittance ratio, the cathode electrode CAT may be formed by patterning in the emissive area EA only.

The transparent display panel 1100 is formed in a top emission type in FIG. 11B. If the transparent display panel 1100 is formed in a top emission type, light is emitted toward the upper substrate. Therefore, the light controlling apparatus 1000 may be arranged below the lower substrate 1101.

In the top emission type, because light of the organic layer EL is emitted toward the upper substrate, the transistor T may be provided in a wide range below the barrier W and the anode electrode AND. Therefore, the top emission type has an advantage in that a design area of the transistor T is wider than that of the bottom emission type. Also, in the top emission type, the anode electrode AND may be formed of a metal material having high reflectivity, such as aluminum or a structure having aluminum and ITO, and the cathode electrode CAT may be formed of a transparent metal material, such as ITO and IZO.

The transparent display panel may be realized in a dual emission type. In the dual emission type, light is emitted toward both the lower substrate 1101 and the upper substrate 1102.

The adhesive layer 1200 bonds the light controlling apparatus 1000 and the transparent display panel 1100 to each other. The adhesive layer 1200 may be a transparent adhesive film such as an optically clear adhesive (OCA) or a transparent adhesive such as an optically clear resin (OCR).

If the light controlling apparatus 1000 is attached to a light emission direction of the transparent display panel 1100, the emissive area EA of the transparent display panel 1100 should not be shielded, whereas the transmissive area TA of the transparent display panel 1100 should be shielded. Therefore, the light controlling apparatus 1000 may form a light shielding area by patterning to shield the transmissive area TA only of the transparent display panel 1100. In this case, the light shielding area may be aligned in the transmissive area TA of the transparent display panel 1100. As described above, if the light controlling apparatus 1000 is attached to the light emission direction of the transparent display panel 1100, the light shielding area of the light controlling apparatus 1000 should be patterned and should be aligned in the transmissive area TA of the transparent display panel 1100, whereby the light controlling apparatus 1000 may be attached to an opposite direction of the light emission direction of the transparent display panel 1100. For example, in the case of the top emission type as shown in FIG. 11B, one surface of the adhesive layer 1200 may be bonded to a surface below the lower substrate 1101 of the transparent display panel 1100, and the other surface of the adhesive layer 1200 may be bonded to the light controlling apparatus 1000. In the case of the bottom emission type as shown in FIG. 11A, one surface of the adhesive layer 1200 may be bonded to a surface above the upper substrate of the transparent display panel 1100, and the other surface of the adhesive layer 1200 may be bonded to the light controlling apparatus 1000. If the adhesive layer 1200 includes a transparent adhesive film, such as OCA or a transparent adhesive such as OCR, the adhesive layer 1200 may have a refractive index between 1.4 and 1.9.

Also, the transparent display device may use dichroic dyes 232 having a good dichroic ratio (DR) to realize a true black. The DR represents a long axis light absorption ratio of the dichroic dyes 232 to a short axis light absorption ratio. Because the dichroic dyes 232 are arranged in a vertical direction (y-axis direction) in a transparent mode, as shown in FIG. 6B, and arranged to be helically rotated by a chiral dopant in a light shielding mode, as shown in FIG. 6A, the short axis light absorption ratio of the dichroic dyes 232 may be a light absorption ratio of the dichroic dyes 232 in the transparent mode, and the long axis light absorption ratio of the dichroic dyes 232 may be a light absorption ratio of the dichroic dyes 232 in the light shielding mode. To realize the transparent display device of a true black, the dichroic dyes 232 may be provides so that a DR of more than 7 is used.

Also, the lower substrate 1101 or the upper substrate of the transparent display panel 1100 may be a second substrate of the light controlling apparatus 1000. In this case, the second electrode 140 of the light controlling apparatus 1000 may be provided on the lower substrate 1101 or the upper substrate of the transparent display panel 1100.

The transparent display panel 1100 may be realized in a display mode in which pixels display an image and a non-display mode in which pixels do not display an image. If the transparent display panel 1100 is realized in a display mode in which pixels display an image, the light controlling apparatus 1000 may be realized in a light shielding mode for shielding the light incident through a rear surface of the transparent display panel 1100 to increase quality of the image.

In the non-display mode in which pixels do not display an image, the light controlling apparatus 1000 may be realized in a light shielding mode or a transparent mode. In the non-display mode in which pixels do not display an image, if the light controlling apparatus 1000 is realized in a light shielding mode, the transparent display device is seen to a user as a black color. In the non-display mode in which pixels do not display an image, if the light controlling apparatus 1000 is realized in a transparent mode, the transparent display device is realized transparently, whereby the user may see a rear background of the transparent display device through the transparent display device.

Figure 12:
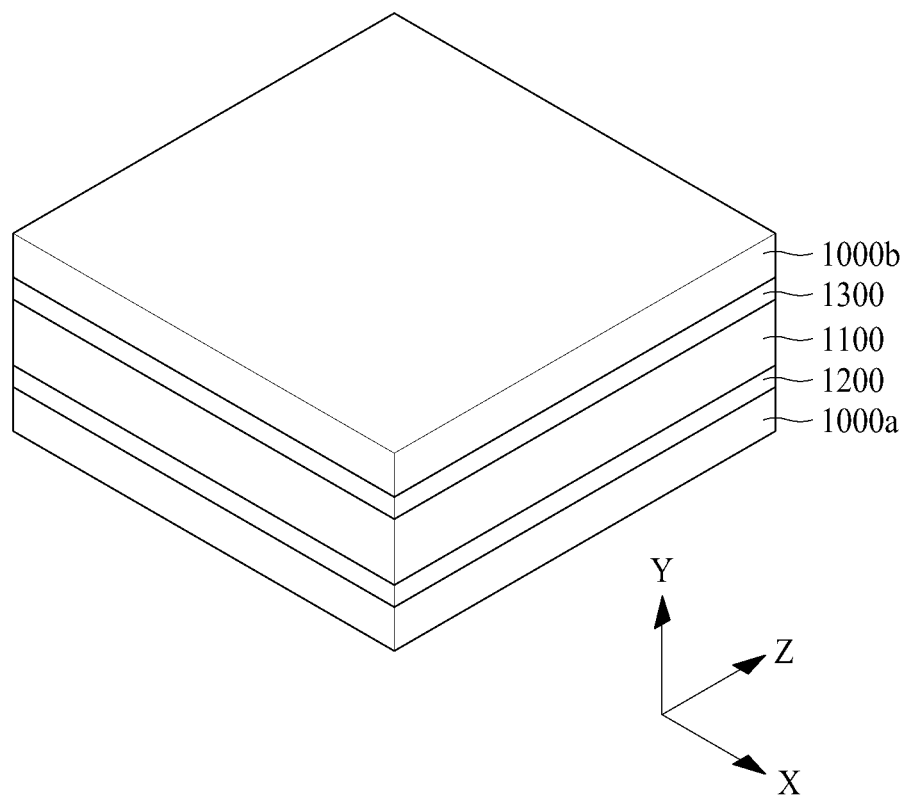
FIG. 12 is a perspective view illustrating a transparent display device according to another embodiment of the present invention.

FIG. 12 is a perspective view illustrating a transparent display device according to another embodiment of the present invention.

As shown in FIG. 12, the transparent display device includes a light controlling apparatus 1000a, a second light controlling apparatus 1000b, a transparent display panel 1100, a first adhesive layer 1200, and a second adhesive layer 1300.

Each of the first and second light controlling apparatuses 1000a and 1000b may be realized as any one of the light controlling apparatuses 100, 200, 300, 400, 500 and 600 according to the embodiments described with reference to FIGS. 1, 2, 3A to 3C, 4, 5, 6A, 6B, 7, 8A, 8B, and 9A to 9C or other embodiments. Therefore, the first and second light controlling apparatuses 1000a and 1000b may shield the incident light in the light shielding mode and transmit the incident light in the transparent mode. Each of the first and second light controlling apparatuses 1000a and 1000b may be realized to provide a user with esthetic effect in addition to a light shielding function in accordance with dichroic dyes.

The transparent display panel 1100 is substantially the same as that described with reference to FIG. 11. Therefore, a detailed description of the transparent display panel 1100 of FIG. 12 will be omitted.

The first adhesive layer 1200 bonds the first light controlling apparatus 1000a and the transparent display panel 1100 to each other. The first adhesive layer 1200 may be a transparent adhesive film such as an optically clear adhesive (OCA). One surface of the first adhesive layer 1200 may be bonded to a surface below a lower substrate 1101 of the transparent display panel 1100 or bonded onto an upper substrate, and the other surface of the first adhesive layer 1200 may be bonded to the first light controlling apparatus 1000a. If the first adhesive layer 1200 is comprised of a transparent adhesive film such as OCA, the first adhesive layer 1200 may have a refractive index between 1.4 and 1.9.

The second adhesive layer 1300 bonds the second light controlling apparatus 1000b and the transparent display panel 1100 to each other. The second adhesive layer 1300 may be a transparent adhesive film such as an optically clear adhesive (OCA). One surface of the second adhesive layer 1300 may be bonded to a surface below the lower substrate 1101 of the transparent display panel 1100 or bonded onto the upper substrate, and the other surface of the second adhesive layer 1300 may be bonded to the second light controlling apparatus 1000b. If the second adhesive layer 1300 is comprised of a transparent adhesive film such as OCA, the second adhesive layer 1300 may have a refractive index between 1.4 and 1.9.

The transparent display panel 1100 may be realized in a display mode in which pixels display an image and a non-display mode in which pixels do not display an image. It is assumed that a user views an image through the second light controlling apparatus 1000b. In this case, if the transparent display panel 1100 is realized in a display mode in which pixels display an image, the first light controlling apparatus 1000a may be realized in a light shielding mode for shielding the light incident through a rear surface of the transparent display panel 1100 to increase quality of the image, and the second light controlling apparatus 1000b is preferably realized in a transparent mode.

In the non-display mode in which pixels do not display an image, the first and second light controlling apparatuses 1000a and 1000b may be realized in a light shielding mode or a transparent mode. In the non-display mode in which pixels do not display an image, if the first and second light controlling apparatuses 1000a and 1000b are realized in a light shielding mode, the transparent display device is seen to a user as a black color. In the non-display mode in which pixels do not display an image, if the first and second light controlling apparatuses 1000a and 1000b are realized in a transparent mode, the transparent display device is realized transparently, whereby the user may see a rear background of the transparent display device through the transparent display device.

Meanwhile, the transparent display panel 1100 may be provided as a dual transparent display panel that may display an image in dual directions. In a display mode in which the dual transparent display panel displays an image in dual directions, if the first and second light controlling apparatuses 1000a and 1000b are realized in a transparent mode, users may view an image in dual directions. Also, in a display mode in which the dual transparent display panel displays an image in dual directions, if any one of the first and second light controlling apparatuses 1000a and 1000b is realized in a light shielding mode, the corresponding light controlling apparatus may prevent the user from viewing an image in any one direction of the dual directions.

As described above, according to the present invention, a number of advantages may be obtained.

For example, the cholesteric liquid crystals may be controlled at the focal conic state to scatter the incident light, whereby light scattering and shielding effects may be increased in the light shielding mode.

Further, the cholesteric liquid crystals may be controlled at the homeotropic state to increase a transmittance ratio of light in the transparent mode. Also, in the present invention, because the light shielding mode may be provided if no voltage is applied, it is advantageous in that separate power consumption is not required for the light shielding mode.

Moreover, because the cholesteric liquid crystals of the liquid crystal layer are arranged randomly at the initial state that no voltage is applied, the alignment film for aligning the liquid crystal layer is not required, whereby the manufacturing process may be simplified and the cost may be reduced.

Also, in examples according to the present invention, the pitch of the cholesteric liquid crystals may be designed to reflect the light of the infrared wavelength range (780 nm or more) or the ultraviolet wavelength range (380 nm or less) not the visible ray wavelength range. Therefore, because the cholesteric liquid crystals do not reflect the light of the visible ray wavelength range, the problem occurring as some of visible rays is reflected and then viewed by a user may be solved.

Further, the cholesteric liquid crystals that reflect the light of the infrared wavelength range or the ultraviolet wavelength range are used, whereby the transmittance ratio may not be deteriorated in the transparent mode and the light shielding ratio may be increased in the light shielding mode.

Also, the planar state of the cholesteric liquid crystals is not used, whereby loss of the transmittance ratio, which is caused by reflection in the transparent mode, may be reduced.

Also, because the rear background of the light controlling apparatus may not be displayed by display of a specific color in accordance with the dichroic dyes included in the liquid crystal layer, the light shielding ratio may be improved.

Further, because the incident light may be more scattered by the polymer networks in the liquid crystal layer, the incident light may be absorbed by the dichroic dyes, whereby the light shielding ratio may be improved.

Also, the spacers for maintaining a cell gap of the liquid crystal layer may be provided to protect the inside of the liquid crystal layer and prevent the first electrode and the second electrode from being shorted when an external force is applied to the liquid crystal layer. Moreover, the spacers may serve as barriers that partition the liquid crystal layer. Therefore, the same amount of the plurality of liquid crystals may be formed in each of the partitioned spaces, or the pitch of the cholesteric liquid crystals may be controlled differently in each of the partitioned spaces to form liquid crystals having different pitches.

Because the pitch P of the cholesteric liquid crystals may be controlled differently, the incident light may be scattered and the rear background of the light controlling apparatus may not be displayed, whereby the light shielding ratio may be improved.

Also, because the light controlling apparatus may include the refractive index matching layers, the difference in a refractive index between the substrate and the air, between the substrate and the electrode or between the electrode and the liquid crystal layer may be reduced.

In addition, the light controlling apparatus may be applied to a transparent display device. Here, in the display mode in which pixels of the transparent display panel display an image, if the light controlling apparatus is realized in the light shielding mode for shielding the light incident upon the rear surface of the transparent display panel, quality of the image displayed by the transparent display panel may be increased.

Also, in the non-display mode in which pixels of the transparent display panel do not display an image, if the light controlling apparatus is realized in the transparent mode, the transparent display device is realized transparently, whereby the user may see the rear background of the transparent display device through the transparent display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light controlling apparatus, comprising:
   first and second substrates facing each other;
   a first electrode on the first substrate;
   a second electrode on the second substrate;
   a liquid crystal layer between the first electrode and the second electrode, the liquid crystal layer including cholesteric liquid crystals, polymer networks, and dichroic dyes;
   a voltage supply unit configured to supply a predetermined voltage to each of the first and second electrodes;
   a spacer partitioning the liquid crystal layer to a plurality of partitioned spaces; and
   a first refractive index matching layer provided between the first electrode and the liquid crystal layer,
   wherein the first refractive index matching layer has a refractive index between the first electrode and the liquid crystal layer,
   wherein the cholesteric liquid crystals have a focal conic state in a light shielding mode in case where no voltage is the predetermined voltages are not applied to the first and second electrodes, and have a homeotropic state in a transparent mode in case where a voltage is the predetermined voltages are applied to the first and second electrodes,
   wherein the polymer networks has a refractive index same as a short-axial refractive index of the cholesteric liquid crystals, and
   wherein a DR represents a long axis light absorption ratio of the dichroic dyes to a short axis light absorption ratio, and the DR is more than 7.

2. The light controlling apparatus of claim 1, wherein the cholesteric liquid crystals are operated at two states depending on the predetermined voltages applied between the first and second electrodes.

3. The light controlling apparatus of claim 1, wherein the first and second substrates lack a liquid crystal alignment film.

4. The light controlling apparatus of claim 1, wherein the cholesteric liquid crystals are arranged randomly in the light shielding mode.

5. The light controlling apparatus of claim 1, wherein the liquid crystal layer further includes dichroic dyes.

6. The light controlling apparatus of claim 5, wherein, in the light shielding mode, the cholesteric liquid crystals scatter incident light, and the dichroic dyes absorb incident light.

7. The light controlling apparatus of claim 5, wherein, in the transparent mode, the cholesteric liquid crystals and the dichroic dyes are arranged in a vertical direction.

8. The light controlling apparatus of claim 1, wherein the liquid crystal layer includes polymer networks.

9. The light controlling apparatus of claim 1, wherein the spacer functions as maintaining a cell gap of the cholesteric liquid crystals between the first electrode and the second electrode.

10. The light controlling apparatus of claim 1, wherein the case where the predetermined voltages are not applied to the first and second electrodes includes a case where a voltage difference between a first voltage applied to the first electrode and a second voltage applied to the second electrode is smaller than a first reference voltage, and the case where the predetermined voltages are applied to the first and second electrodes includes a case where the voltage difference between the first voltage and the second voltage is greater than a second reference voltage.

11. The light controlling apparatus of claim 1, wherein the case where the predetermined voltages are not applied to the first and second electrodes includes a case where a voltage difference between a first voltage applied to the first electrode and a second voltage applied to the second electrode is smaller than a reference voltage, and the case where the predetermined voltages are applied to the first and second electrodes includes a case where the voltage difference between the first voltage and the second voltage is equal to or greater than the reference voltage.

12. The light controlling apparatus of claim 1, wherein the cholesteric liquid crystals reflect light of an infrared wavelength range or an ultraviolet wavelength range.

13. The light controlling apparatus of claim 1, wherein the first and second substrates are spaced apart in a first direction, wherein each of the partitioned spaces having a same height in the first direction, wherein each of the partitioned spaces has a same amount of cholesteric liquid crystals, and wherein a pitch of the cholesteric liquid crystals varies for each of the partitioned spaces.

14. A transparent display device, comprising:
    a transparent display panel including a transmissive area and an emissive area displaying an image; and
    a light controlling apparatus on at least one surface of the transparent display panel,
    wherein the light controlling apparatus includes a liquid crystal layer having cholesteric liquid crystals, polymer networks, dichroic dyes, and a spacer partitioning the liquid crystal layer into a plurality of partitioned spaces, the liquid crystal layer having a focal conic state in a display mode in which the emissive area displays the image, whereby a light shielding mode for shielding incident light is realized,
    wherein the polymer networks has a refractive index same as a short-axial refractive index of the cholesteric liquid crystals, and
    wherein a DR represents a long axis light absorption ratio of the dichroic dyes to a short axis light absorption ratio, and the DR is more than 7.

15. The transparent display device of claim 14, wherein the liquid crystal layer further includes dichroic dyes.

16. The transparent display device of claim 15, wherein the cholesteric liquid crystals have a homeotropic state such that the light controlling apparatus is realized in a transparent mode for transmitting incident light in a non-display mode in which the emissive area does not display the image.

17. The transparent display device of claim 15, wherein the cholesteric liquid crystals have a focal conic state such that the light controlling apparatus is realized in a light shielding mode for shielding incident light in a non-display mode in which the emissive area does not display the image.

18. The transparent display device of claim 15, wherein the light controlling apparatus further includes a first electrode and a second electrode, and a liquid crystal layer between the first electrode and the second electrode has the focal conic state in case where no voltage is applied, and has the homeotropic state in case where the voltage is applied.

* * * * *